United States Patent
Bezama et al.

(10) Patent No.: US 7,139,172 B2
(45) Date of Patent: Nov. 21, 2006

(54) APPARATUS AND METHODS FOR MICROCHANNEL COOLING OF SEMICONDUCTOR INTEGRATED CIRCUIT PACKAGES

(75) Inventors: Raschid Jose Bezama, Mahopac, NY (US); Evan George Colgan, Chestnut Ridge, NY (US); John Harold Magerlein, Yorktown Heights, NY (US); Roger Ray Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 351 days.

(21) Appl. No.: 10/883,392

(22) Filed: Jul. 1, 2004

(65) Prior Publication Data

US 2006/0002088 A1 Jan. 5, 2006

(51) Int. Cl.
*H05K 7/20* (2006.01)
(52) U.S. Cl. .................. 361/699; 361/700; 165/80.4; 257/714; 257/715; 174/15.1
(58) Field of Classification Search .................. None
See application file for complete search history.

(56) References Cited

U.S. PATENT DOCUMENTS

| | | | |
|---|---|---|---|
| 4,573,067 A | 2/1986 | Tuckerman et al. | 357/82 |
| 5,099,311 A | 3/1992 | Bonde et al. | 357/82 |
| 5,218,515 A | 6/1993 | Bernhardt | 361/385 |
| 5,388,635 A | 2/1995 | Gruber et al. | 165/80.4 |
| 5,801,442 A | 9/1998 | Hamilton et al. | 257/714 |
| 5,998,240 A | 12/1999 | Hamilton et al. | 438/122 |
| 6,101,715 A | 8/2000 | Fuesser et al. | 29/890.03 |
| 6,253,835 B1 | 7/2001 | Chu et al. | 165/80.4 |
| 6,301,109 B1 | 10/2001 | Chu et al. | 361/690 |
| 6,935,411 B1 * | 8/2005 | Valenzuela | 165/80.4 |
| 6,981,849 B1 * | 1/2006 | Kim et al. | 417/50 |
| 6,988,534 B1 * | 1/2006 | Kenny et al. | 165/80.4 |
| 6,988,535 B1 * | 1/2006 | Upadhya et al. | 165/80.4 |
| 6,991,024 B1 * | 1/2006 | Goodson et al. | 165/80.4 |
| 6,994,151 B1 * | 2/2006 | Zhou et al. | 165/80.4 |
| 2004/0188066 A1 * | 9/2004 | Upadhya et al. | 165/80.4 |

\* cited by examiner

*Primary Examiner*—Boris Chervinsky
(74) *Attorney, Agent, or Firm*—F. Chau & Associates; Frank V. DeRosa

(57) ABSTRACT

Apparatus and methods are provided for microchannel cooling of electronic devices such as IC chips, which enable efficient and low operating pressure microchannel cooling of high power density electronic devices having a non-uniform power density distribution, which are mounted face down on a package substrate. For example, integrated microchannel cooler devices (or microchannel heat sink devices) for cooling IC chips are designed to provide uniform flow and distribution of coolant fluid and minimize pressure drops along coolant flow paths, as well as provide variable localized cooling capabilities for high power density regions (or "hot spots") of IC chips with higher than average power densities.

18 Claims, 17 Drawing Sheets

COOLANT OUT    COOLANT IN    COOLANT OUT

APPARATUS AND METHODS FOR MICROCHANNEL COOLING OF SEMICONDUCTOR INTEGRATED CIRCUIT PACKAGES

TECHNICAL FIELD OF THE INVENTION

The present invention relates generally to apparatus and methods for cooling electronic devices. More specifically, the present invention relates to microchannel cooling apparatus and methods which provide improved fluid distribution and flow mechanisms for efficient cooling of semiconductor integrated circuit (IC) chip packages, as well as increased localized cooling capabilities for high power density regions of semiconductor chips.

BACKGROUND

In the design and manufacture of semiconductor IC (integrated circuit) chip packages and modules, it is imperative to implement mechanisms that can effectively remove heat generated by IC chip devices (such as microprocessors) to ensure continued reliable operation of such devices. Indeed, heat removal is particularly important for computer processor chips that are disposed in SCM (single chip modules) or MCMs (multichip modules), for example, which can generate significant amounts of heat. The ability to efficiently remove heat becomes increasing problematic as chip geometries are scaled down and operating speeds are increased, resulting in increased power density. Although IC chip modules are being continually designed to operate at higher clock frequencies, increased system performance is becoming limited primarily by the ability to effectively remove heat from such IC chip modules.

There are various heat removal techniques that have been developed for cooling semiconductor IC packages/modules and other electronic devices. For example, microchannel cooling apparatus and methods have been proposed for cooling electronic devices such as IC chips, MCMs, diode laser arrays, and other electro-optic devices under conditions of increased heat flux (power/unit area) or high power densities (e.g., ~800 W/cm$^2$).

FIGS. 1A and 1B are schematic diagrams that illustrate a conventional microchannel cooling apparatus, such as described in U.S. Pat. No. 4,573,067, wherein FIG. 1B illustrates a cross-section view of FIG. 1A along the line 1B. As shown, a semiconductor chip (10) includes circuits that are formed in a front surface region (11) of the semiconductor chip (10). A rear surface of the chip (10) is processed to form a recessed region (12) and a plurality of parallel, microscopic heat conducting fins (14) rising from the recessed region (12), which define a plurality of channels (13). A transparent cover (15) engages the surface of chip (10) and the tops of the fins (14) thereby defining a chamber for the flow of a coolant through the channels (13) between the input and output ports (16) and (17) in the transparent cover (15), wherein heat removal is achieved by thermal contact between the fins (14) and the coolant fluid that flows through the channels (13).

There are a number of disadvantages associated with the cooling apparatus depicted in FIGS. 1A and 1B. For instance, such design results in significant pressure drops and non-uniform flow distribution due to, e.g., the use of one heat exchanger zone (with long channel length) between the input port (16) and the output port (17), and having an input port (16) and output port (17) with a cross sectional area that is smaller than the total microchannel cross sectional area. Furthermore, the process of forming the fins (14) and channels (13) directly in the non-active surface of the IC chip (10) can result in reduced yield for the chips (10), which is not desirable especially for expensive chips such as microprocessors. Indeed, if the microchannel cooler fails or leaks, the chip, which is much more expensive than the cooler in the case of a high performance processor, is lost along with the microchannel cooler.

FIGS. 2A~2C schematically illustrate another conventional microchannel cooling apparatus, such as described in U.S. Pat. No. 5,998,240. FIG. 2A depicts a silicon chip (20) having a region containing a plurality of microchannels (21) formed therein, which comprise a plurality of close-ended slots or grooves of generally rectangular cross-section. As depicted in FIG. 2B, the chip (20) sits on a ceramic frame (22) that includes three generally rectangular coolant manifolds (23), (24) and (25). The center manifold (24) comprises a coolant input manifold having a coolant inlet port (27) formed at one end, while the two outer manifolds (23) and (25) comprise output manifolds and include coolant outlet ports (26) and (28) at the opposite end from the inlet port (27). The die (20) is oriented with respect to the ceramic substrate (22) such that the microchannels (21) are orthogonal to the manifolds (23), (24) and (25). As depicted in FIG. 2C, the chip (20) and the ceramic substrate (22) are mounted on a ground plane (29) having two coolant output ducts (29a) and a single coolant input duct (29a), wherein the liquid coolant flow direction is shown by the arrows.

There are a number of disadvantages with the conventional microchannel cooling apparatus depicted in FIGS. 2A~2C. For instance, if the substrate (22) comprising the manifold channels (23, 24, 25) was fabricated using Silicon, the substrate would be weak and likely break during fabrication due to the formation of the multiple channels through the substrate with sharp-edge corners. Moreover, such design results in significant pressure drops and non-uniform flow distribution, which result from (i) the input and output ports (26, 27, 28) having a smaller cross sectional area than the total microchannel cross sectional area, (ii) the manifolds (23, 24, 25) having grooves which are of constant cross section feeding the microchannels (21) and (iii) having the microchannels (21) continue below the inlet manifold groove (24) when two outlet manifold grooves (23, 25) are used.

FIGS. 3A and 3B are schematic diagrams illustrating other conventional microchannel cooling structures, such as described in U.S. Pat. No. 5,218,515. FIG. 3A illustrates a cut-away perspective view of an integrated circuit module (30), which includes an IC chip (31) having solder bump bonding sites (32) along a front (active) surface (31a) of the chip (31). A back (non-active) surface (31b) of the chip (31) is thermally bonded to a microchannel structure (33). A plurality of microchannels (33a) are formed in the microchannel structure (33). A cover manifold (34) is bonded to the microchannel structure (33). Input and output coolant delivery channels (34a) and (34b) are cut or formed in the cover manifold (34) as illustrated.

FIG. 3B illustrates a coolant supply manifold (35) which is used to supply coolant for a multi-chip module (MCM) package comprising an array of the microchannel cooled IC modules (30) mounted face down on a common substrate or circuit board. The coolant supply manifold (35) includes a plurality of coolant supply channels (e.g. (36), (37), (38) and (39)), wherein channels (36) and (38) are higher pressure channels while channels (37) and (39) are lower pressure channels. The manifold (35) is adapted for placement over a printed wiring card so that, e.g., the openings (36a) and (37a) in respective coolant supply channels (36) and (37) mate with the openings (34a) and (34b) in the individual integrated circuit modules (30) on the circuit board. Elastomer seals are used to couple the coolant supply manifold (35) with the integrated circuit modules (30).

There are disadvantages associated with the microchannel cooling apparatus depicted in FIGS. 3A and 3B. For instance, the microchannel coolers (30) are formed with one heat exchanger zone (between the input and output manifold channels (34a, 34b)), which can result in significant pressure drops of fluid flow along the microchannels (33a). Moreover, if a cover manifold (34) was formed with multiple coolant delivery channels (e.g., 34a) for multiple heat exchanger zones to reduce the pressure drop, the cover manifold (34) would be fragile and likely to break during fabrication, thereby reducing manufacturing yield.

Furthermore, the coolant supply manifold (35) design of FIG. 3B can result in large pressure drops and significant non-uniform flow distribution due to the channels, which feed a given column of four microchannel inlets, having a constant cross-sectional area. For instance, as depicted in FIG. 3B, the supply channel (36) feeds coolant fluid to four coolant delivery manifolds (34a) of module (30) (FIG. 3A) via the four openings (36a). Assume V, $\Delta P$, and Q are the velocity, differential pressure and total flow in the last manifold segment, i.e., between the bottom two microchannel inlets, then the segment above will desirably have velocity 2V, and total flow 2 Q. This higher velocity will result in a segment pressure drop equal to ~$2\Delta P$ if the flow is laminar and ~$4\Delta P$ if the flow is turbulent (given the linear dependency between flow and pressure drop when the flow is laminar, but quadratic dependency when the flow is turbulent). Thus, for a manifold channel with constant cross-section feeding four microchannel inlets, we can expect a total manifold channel pressure drop of ~10 $\Delta P$ if the flow is laminar, and ~30 $\Delta P$ if the flow is turbulent. This large pressure drop will induce flow variations within the different microfin sections that can not be compensated with a return line, also with constant cross-section but with reverse orientation relative to the inlet line. Since the manifold channel has to carry significantly larger water flow than a given microchannel, both velocity and cross-section will be higher, therefore, it is easy to expect (or difficult to avoid) having a 10× increase in the Reynolds number between these two sections. For low cooling capability, like less than 50 W/cm$^2$, the water flow requirements are low, and it is possible to have both manifold channels and microchannels with laminar flow regimes, but at high flows this is not possible since the microchannels will require flow regimes with Reynolds number in the 100–200 range, then, the flow regime in the manifold channel will not be laminar.

Another disadvantage associated with the conventional designs discussed above is that no mechanisms are provided for efficient heat removal for IC chips, such as processors, that have "hot spot" regions, i.e., regions of the chip which can have a heat flux (power/unit area) that is significantly greater than the average heat flux of the chip, which could result in temperatures ~20° C. hotter than the average chip temperature. Indeed, one thermal solution which is designed for efficiently removing heat that is generated due to average chip power density, may not be adequate for removing heat at "hot spot" regions of the chip, which can result in failure of the chip devices in or near the "hot spot" region.

SUMMARY OF THE INVENTION

Exemplary embodiments of the invention generally include apparatus and methods for cooling of electronic devices and, in particular, apparatus and methods for microchannel cooling of IC (integrated circuit) chips having a non-uniform power density distribution, which are mounted face down on a package substrate. More specifically exemplary embodiments of the invention include microchannel cooling apparatus and methods which implement mechanisms to provide variable localized cooling capabilities for high power density regions (or "hot spots") of semiconductor chips with higher than average power densities to locally increase the cooling capacity for "hot spot" areas on an IC chip with higher than average power densities.

For example, in one exemplary embodiment of the invention, an integrated microchannel cooler device is provided for cooling an IC (integrated circuit) chip having a non-uniform power map. The microchannel cooler device comprises a plurality of alternating input and output manifolds that extend in a same direction within the integrated cooler device and a plurality of heat exchanger zones. Each heat exchanger zone comprises a plurality of thermal microfins which define a microchannel pattern of microchannels which extend between an adjacent input and output manifold to provide fluid flow paths between the adjacent input and output manifold. The microchannel pattern of one or more of the heat exchanger zones is varied to provide a heat transfer performance that corresponds to an expected power map of the IC chip. The input and output manifolds and microchannel patterns of the heat exchanger zones are structured so as to provide an average fluid velocity in a region of a heat exchanger zone that corresponds to an expected hot spot region of the IC chip, which is substantially the same as, or at least within about 50% of, an average fluid velocity in other regions of the heat exchanger zone that do not correspond to an expected hot spot region of the IC chip.

In another exemplary embodiment of the invention, at least one input manifold of the integrated microchannel cooler device is arranged to align with an expected hot spot region of the IC chip. In another embodiment, the microchannel pattern of one or more of the heat exchanger zones is varied locally to provide a heat transfer performance that corresponds to local variations of the expected power map of the IC chip. In yet another embodiment, at least one heat exchanger zone comprises a first pattern of microchannels that provides a heat transfer performance sufficient for an expected average power density of the IC chip and a second pattern of microchannels that is disposed to correspond to an expected hot spot region of the IC chip, wherein the second pattern of microchannels provides a heat transfer performance sufficient for an expected greater than average power density of the hot spot.

These and other exemplary embodiments, aspects, features, and advantages of the present invention will become apparent from the following detailed description of the preferred embodiments, which is to be read in connection with the accompanying drawings.

DETAILED DESCRIPTION OF EXEMPLARY EMBODIMENTS

Figure 1A:
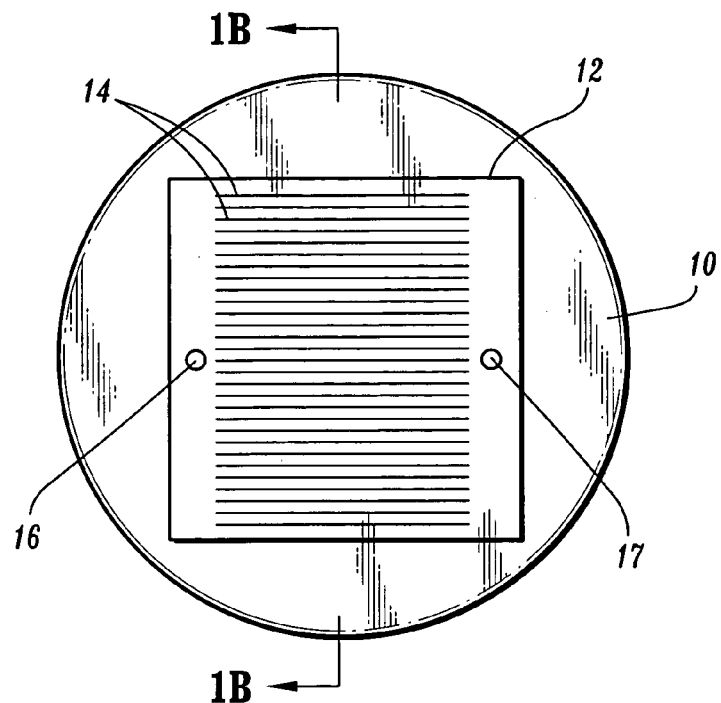
FIGS. 1A and 1B are schematic diagrams that illustrate a conventional apparatus for microchannel cooling an IC chip.
Figure 1B:
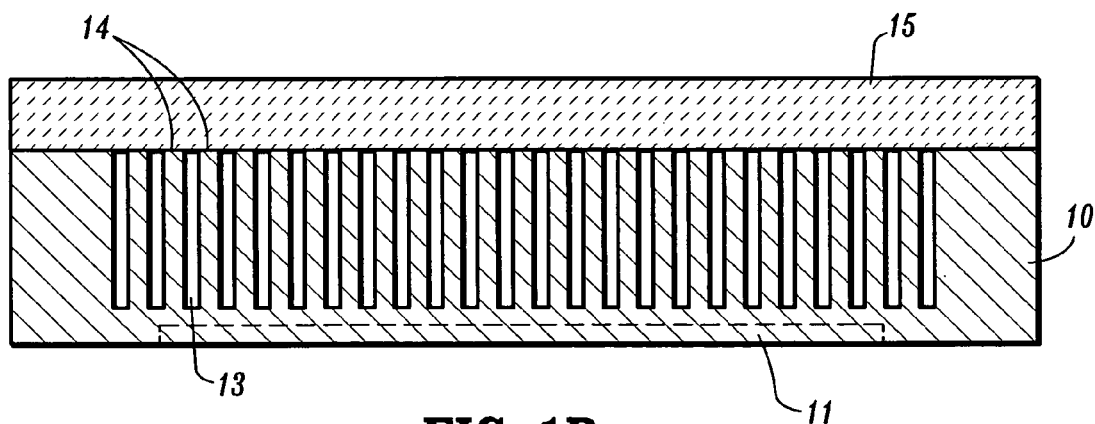
Figure 2A:
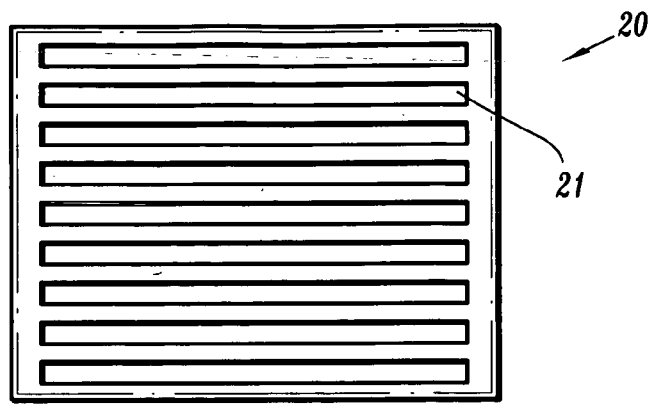
FIGS. 2A–2C are schematic diagrams that illustrate another conventional apparatus for microchannel cooling an IC chip.
Figure 2B:
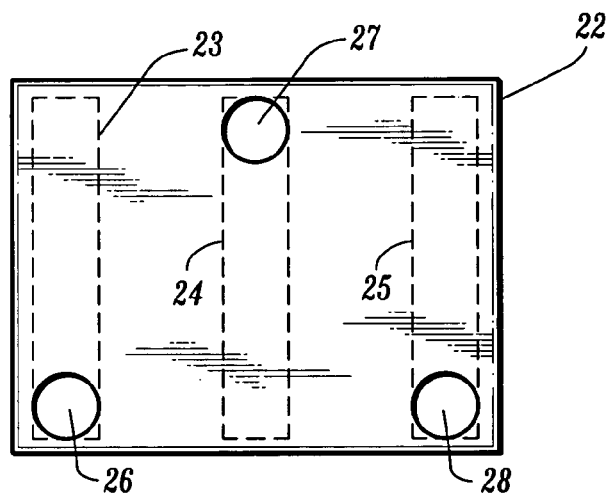
Figure 2C:
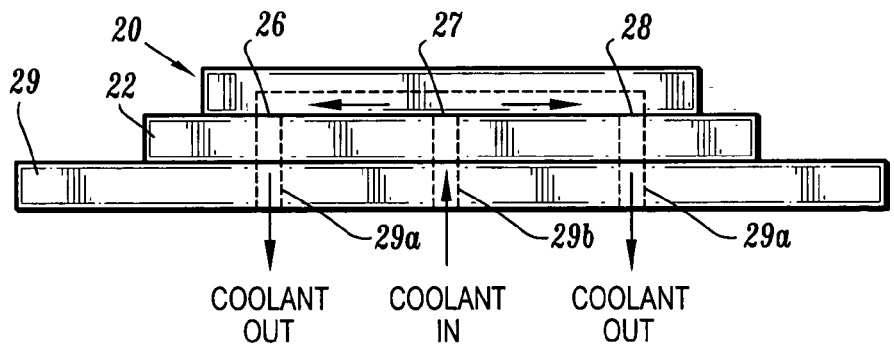
Figure 3A:
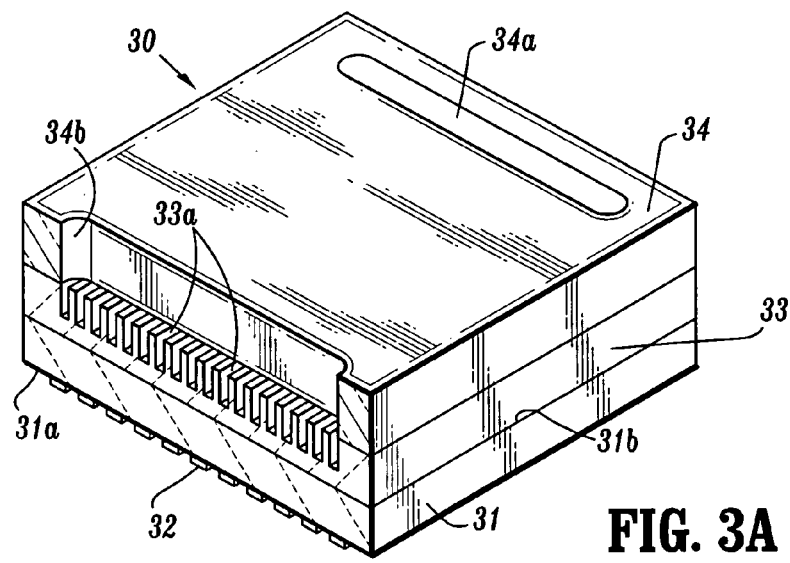
FIGS. 3A and 3B are schematic diagrams that illustrate conventional apparatus for microchannel cooling IC chips for an MCM (multi-chip module).
Figure 3B:
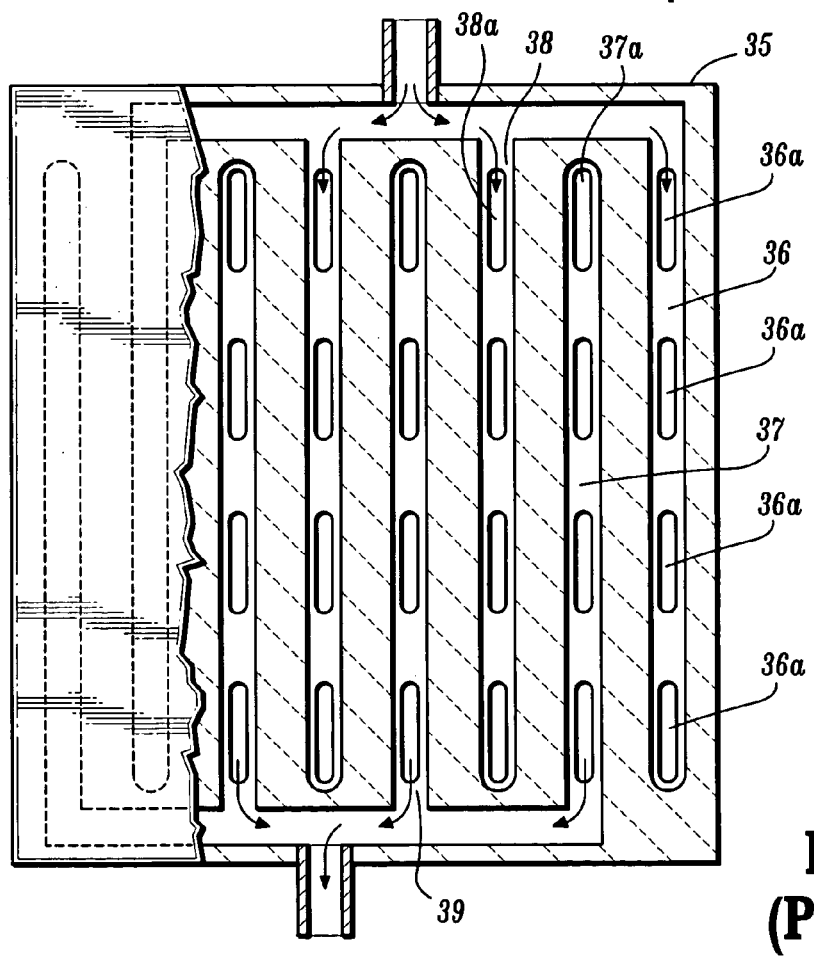

Exemplary embodiments of the invention as described herein generally include apparatus and methods for cooling of electronic devices and, in particular, apparatus and methods for microchannel cooling of IC (integrated circuit) chips mounted face down on a package substrate, where the IC chips may have a non-uniform power density distribution. In general, an apparatus for microchannel cooling an electronic device according to one exemplary embodiment of the invention comprises an integrated microchannel cooler device (or microchannel heat sink) that is thermally bonded to a non-active surface of an IC chip mounted face down on a package substrate, and a fluid distribution manifold device, which is removably coupled to the integrated microchannel device via a mechanically compliant gasket, to deliver coolant fluid to/from the integrated microchannel device. Microchannel cooling apparatus and methods according to various exemplary embodiments as described herein implement fluid distribution and flow mechanisms which foster uniform flow of coolant fluid and which prevent/mitigate reduction of pressure of the coolant fluid along the coolant flow paths, to thereby provide high cooling rate capability and efficiency for cooling electronic devices such as semiconductor integrated circuit (IC) chip packages/modules. In other embodiments, microchannel cooling apparatus and methods implement mechanisms that provide variable localized cooling capabilities for high power density regions (or "hot spots") of semiconductor chips to locally increase the cooling capacity at areas on an IC chip having higher than average power densities.

More specifically, exemplary embodiments of the invention include various frameworks/architectures for integrated microchannel cooler devices that can be thermally bonded to IC chips, which are designed to optimize the distribution and flow of coolant fluid for efficient heat removal. For example, in one exemplary embodiment of the invention, an integrated microchannel cooler device comprises a microchannel plate having a plurality of microchannels defined by microfins formed in one surface of the microchannel plate, and a manifold plate (or manifold cover), which is bonded to the microchannel plate, having a plurality of coolant supply/return manifolds. In another exemplary embodiment of the invention, an integrated microchannel cooler device comprises a single plate that is constructed with both microchannels and supply/return manifolds structures. In all such embodiments, an integrated microchannel cooler device includes supply/return manifolds and microchannels/microfins that are structured, patterned, dimensioned and/or arranged in a manner that minimizes pressure drop and increases uniformity of fluid flow and distribution along coolant flow paths and/or enables variable localized cooling for hot spot regions of a chip.

An integrated microchannel cooler device according to one exemplary embodiment of the invention will now be discussed in detail with reference to the exemplary embodiments of FIGS. 4A~4D and FIGS. 5A~5B, for example. In particular, FIGS. 4A~4D are schematic diagrams illustrating a manifold plate (40) according to an exemplary embodiment of the invention, which can be bonded to a corresponding microchannel plate (50) as depicted in the exemplary schematic diagrams of FIGS. 5A–5B, to form an integrated microchannel cooler device.

More specifically, with initial reference to the illustrative views of FIGS. 4A~4D, an exemplary manifold plate (40) comprises a planar substrate (41) having a plurality of fluid manifolds (M1~M7) (or denoted generally, Mi) formed therein. Each fluid manifold (M1~M7) comprises a corresponding manifold channel (C1~C7) (or more generally, Ci) formed in one surface (S2) of the substrate (41) and a corresponding pattern/series of fluid vias (V1~V7) (or more generally, Vi) having a plurality of fluid vias (v) that form openings which extend from a surface (S1) (which is opposite the surface (S2)) to various points along the corresponding manifold channels (C1~C7). As explained below, the fluid manifolds (Mi) are structured, patterned, dimensioned and/or arranged in a manner that enables the manifold plate (40) to provide a uniform flow distribution and reduce overall system pressure drop, as well as maintain the structural integrity of the manifold plate to prevent breakage during manufacturing.

Figure 4A:
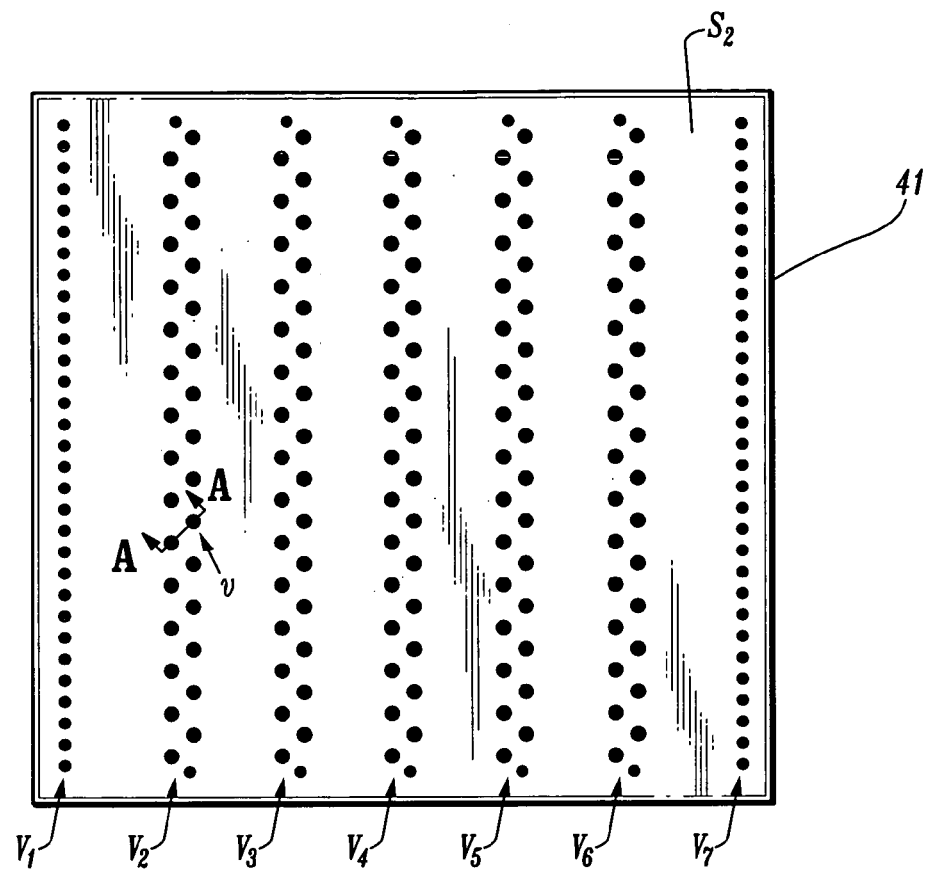
FIGS. 4A~4D are exemplary schematic diagrams that illustrate a manifold plate and method for fabricating the manifold plate, according to an exemplary embodiment of the invention.
Figure 4B:
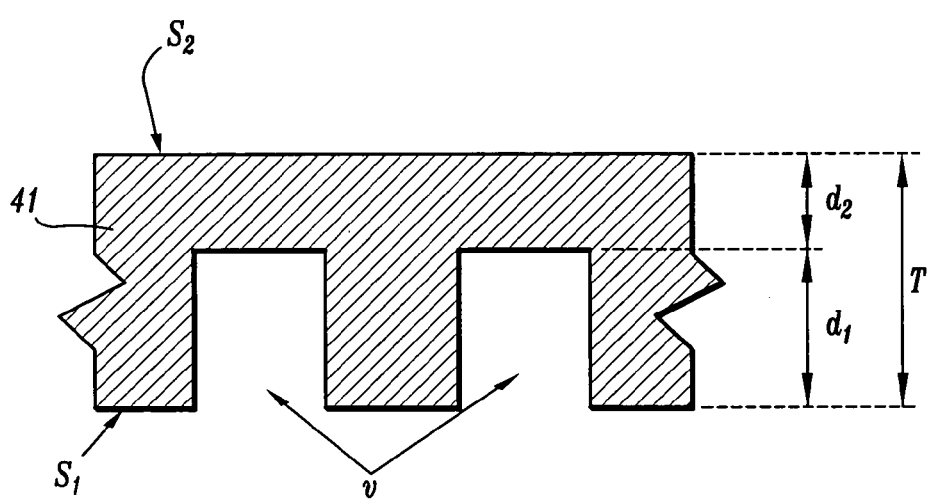

More specifically, FIG. 4A is a schematic plan view of the manifold plate (40) at one stage of production in which the plurality of patterns/series of fluid vias (V1~V7) are formed in one surface (S1) of the planar substrate (41), which is the bottom surface of the substrate (41) in the illustrative view. In other words, FIG. 4A depicts the patterns of vias (V1~V7) as viewed from a top surface (S2) of the substrate (41) which is opposite the bottom surface (S1) in which the vias (v) are formed. FIG. 4B is a schematic cross-sectional view of a portion of the substrate (41) along line AA of FIG. 4A, which illustrates the substrate (41) having a thickness (T) and the vias (v) being formed to a depth (d1) below the substrate surface (S1) (i.e., the vias are not formed entirely through the substrate (40)). In one exemplary embodiment of the invention in which the substrate (41) is formed of silicon (Si), the fluid vias can be formed using a deep Si etching method to etch the fluid vias partially through the substrate (41). In particular, in one exemplary embodiment, for a typical silicon wafer substrate having a thickness, T, of 0.75 mm, the fluid vias (v) can be formed to a depth of $d_1=0.50$ mm. Further, the fluid vias can be circular holes with a diameter of about 450 microns. It is to be noted that although circular holes are shown in the exemplary embodiment, the fluid vias may be formed with other shapes, preferably with rounded corners (as compared to shapes with sharp corners that act as stress concentration sites which can increase the possibility of breakage of the components during manufacturing).

As depicted in the exemplary embodiment of FIG. 4A, via patterns (V1) and (V7) comprise a series of circular openings that are arranged in a linear pattern, and the via patterns (V2)~(V6) each comprise a series of circular openings arranged in a zig-zag pattern. As explained below, a fabrication method in which the manifolds are constructed by forming a series of circular openings in a zig-zag pattern reduces the potential of wafer (or substrate) breakage during manufacturing of the manifold plate, when forming multiple manifolds to define multiple heat exchanger zones.

Figure 4C:
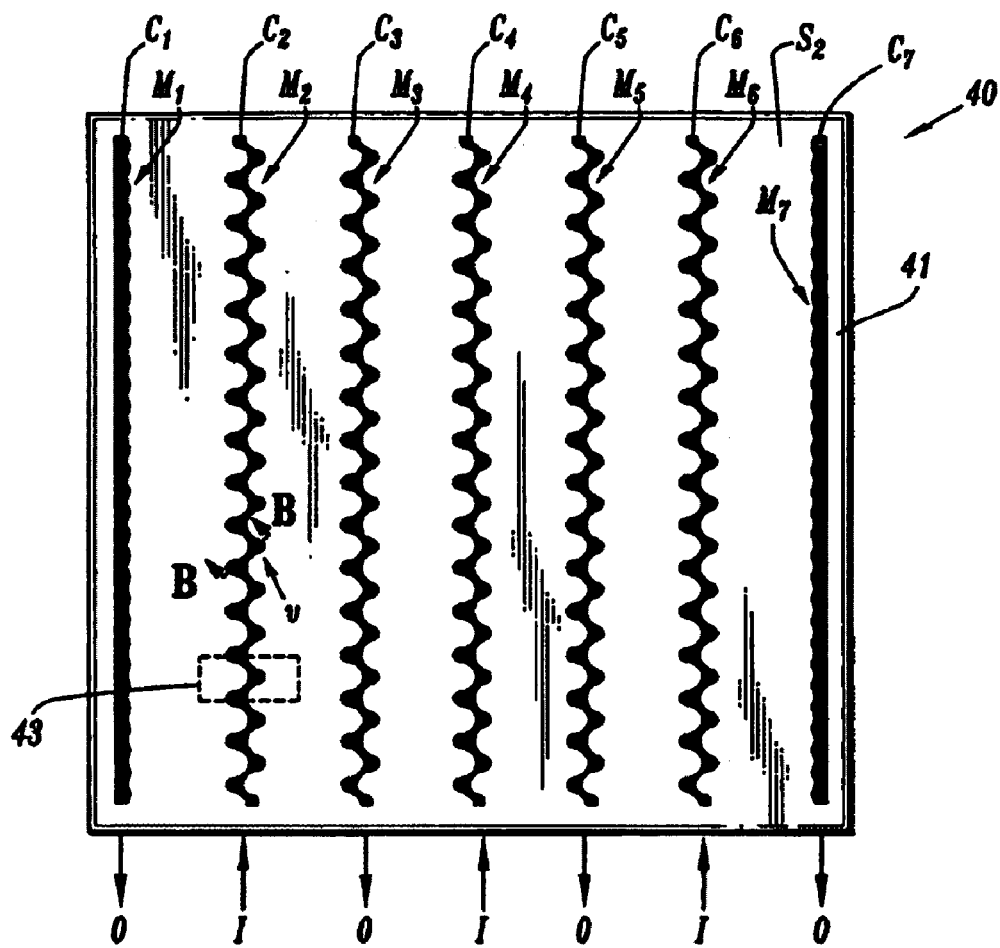
Figure 4D:
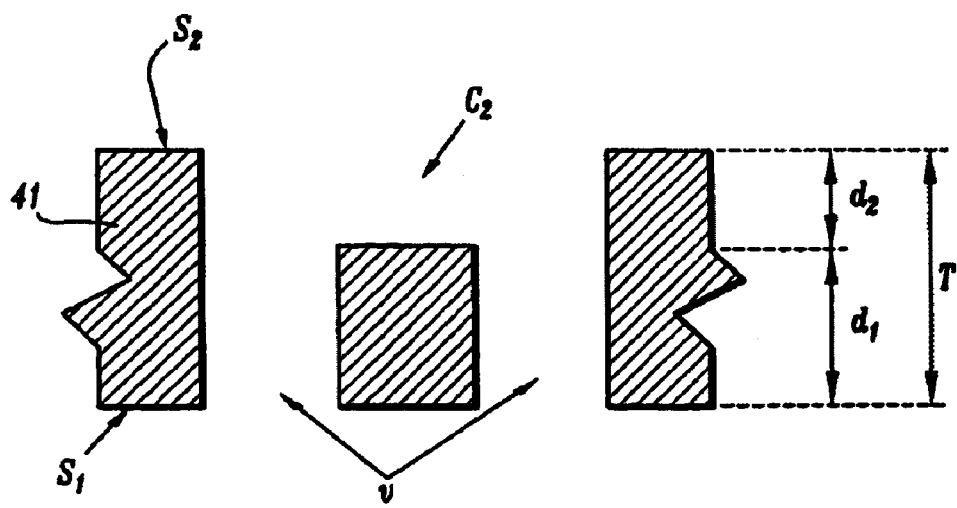

Each pattern/series of fluid vias (Vi) comprises a plurality of openings that serve as fluid inlets/outlets to a corresponding input/output manifold channel (Ci) that is formed on the surface (S2) of the substrate (41) opposite the surface (S1) in which the patterns of fluid vias (Vi) are formed. For example, FIG. 4C illustrates a schematic plan view of the exemplary manifold plate (40) at another stage of production in which manifold channels (C1~C7) are formed in the surface (S2) of the substrate (41), wherein each manifold channel (C1~C7) comprises a continuous cavity that is patterned and recessed to a depth that is sufficient to connect to each fluid via (v) of a corresponding pattern of fluid vias (V1~V7). More specifically, FIG. 4D is a schematic cross-sectional view of a portion of the substrate (41) along line BB of FIG. 4C, which illustrates a channel segment of the manifold channel C2, which is formed between two vias (v) by etching a recess between the vias (v) in the substrate (41) to a sufficient depth, $d_2$, below the surface (S2) of the substrate (41) to connect with the fluid vias (v). Continuing with the exemplary embodiment described with respect to FIG. 4B wherein the substrate (41) of the manifold plate (40) is formed of silicon, the manifold channels (Ci) can be formed using a deep Si etching process to etch the recesses to a depth of $d_2=0.25$ mm.

Figure 6:
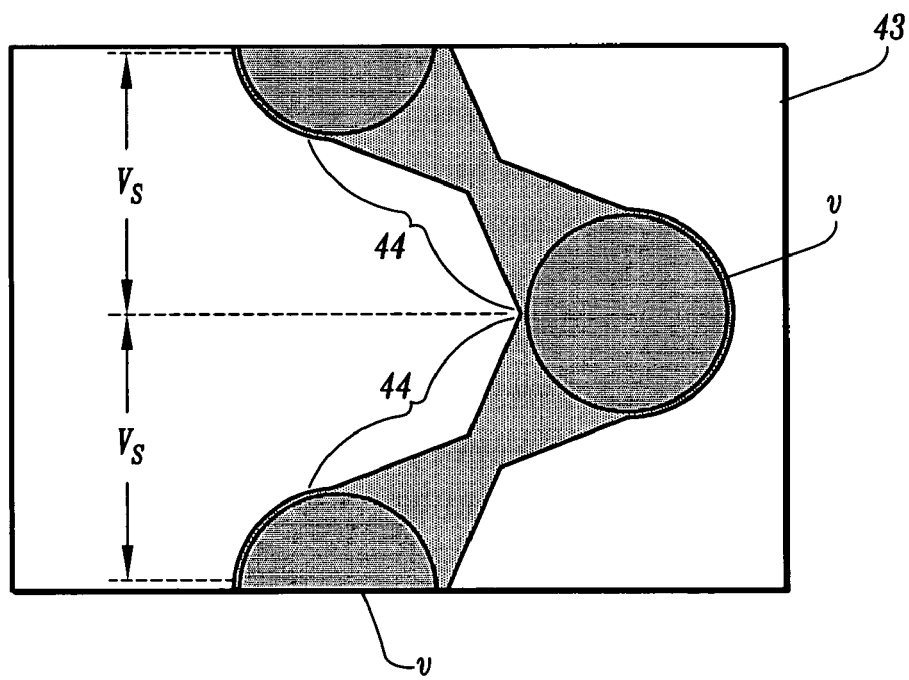
FIG. 6 is schematic detailed illustration of a portion of a manifold structure according to an exemplary embodiment of the invention.
Figure 9A:
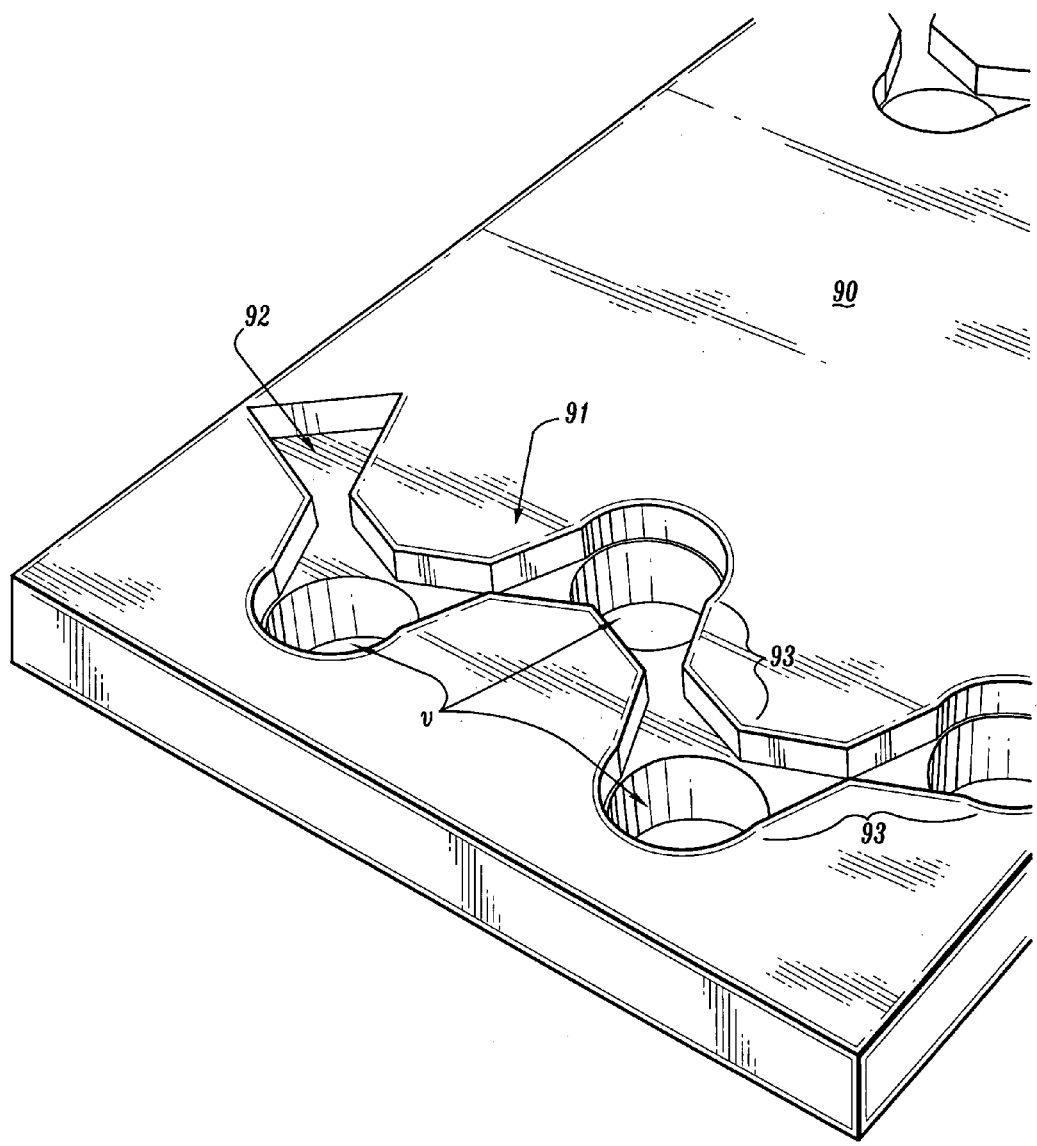
FIG. 9A~9C are schematic diagrams of perspective views that illustrate an apparatus for microchannel cooling a semiconductor chip according to another exemplary embodiment of the invention.

Furthermore, in an exemplary embodiment of the invention, the manifolds (Mi) comprise manifold channels (Ci) that are formed having a variable cross-sectional area. For instance, FIG. 6 is schematic detailed view of the manifold structure for a portion of the fluid manifold (M2) in region (43) as depicted in FIG. 4C. In the exemplary view of FIG. 6, the channel segments (44) between the fluid vias (v) form tapered recesses which taper down away from the fluid vias (v) to decrease the channel cross-sectional area. Details of the exemplary manifold structure are further depicted in FIG. 9A, which depicts a three-dimensional perspective view of a manifold channel (91) having a zig-zag pattern, which is formed in a manifold plate (90). In particular, FIG. 9A depicts a plurality of fluid vias (v) that form openings to a manifold channel (92), wherein the manifold channel (92) is patterned such that channel segments (93) between two fluid vias (v) form tapered recesses.

Advantageously, the tapered manifold channel widths help to minimize dynamic pressure drop along the channels by maintaining the flow velocity of the coolant fluid relatively constant. More specifically, varying the cross-sectional area of the manifold channels (Ci) provides a means for reducing dynamic pressure drop along the manifold channels (Ci) and thereby enabling the manifold channels (Ci) to uniformly distribute the flow of coolant fluid to/from microchannel inlet/outlets that are disposed along the manifold channels (Ci).

Figure 5A:
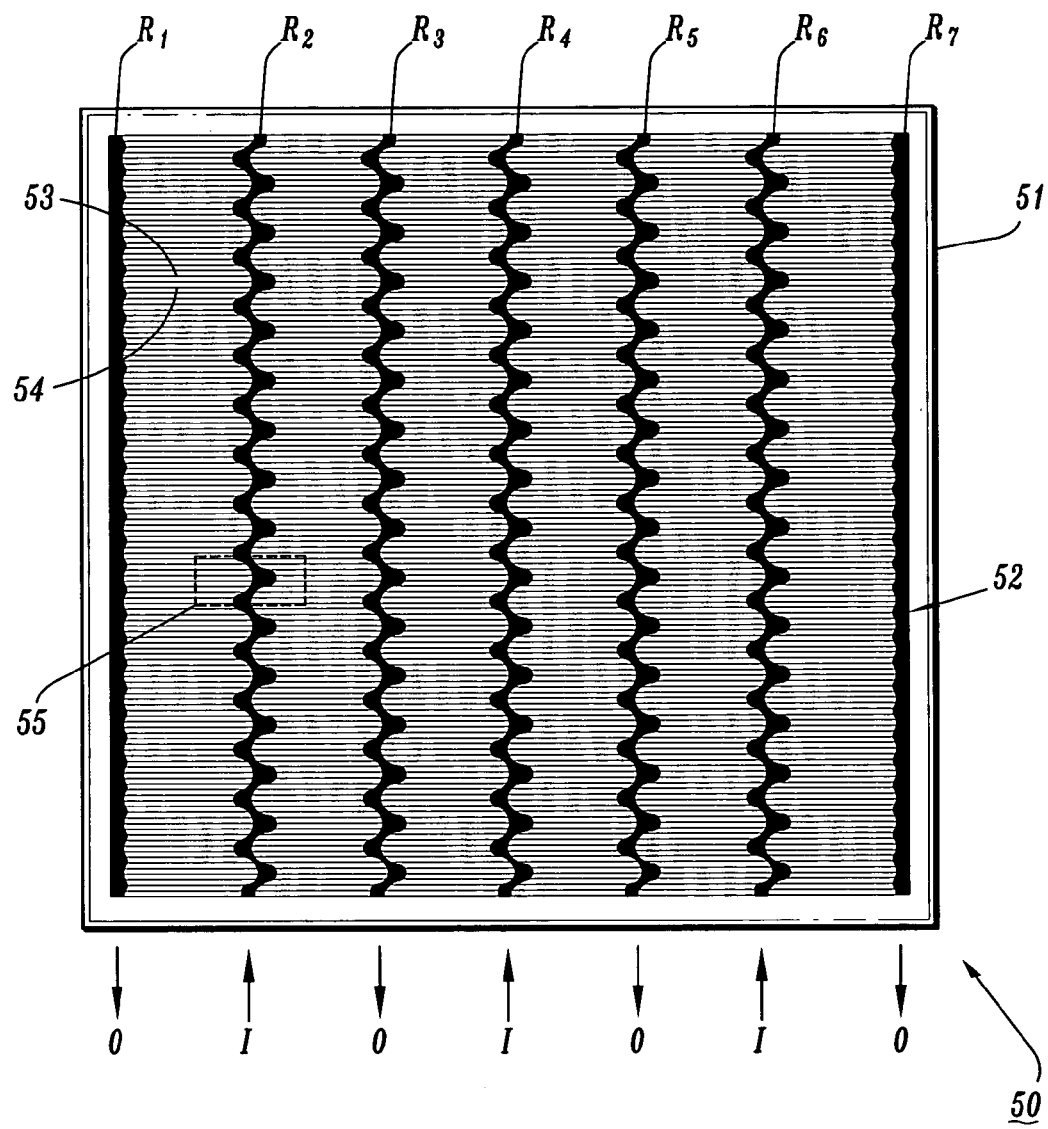
FIGS. 5A~5B are schematic diagrams that illustrate a microchannel plate according to an exemplary embodiment of the invention, which can be joined with the exemplary manifold plate of FIGS. 4A~4D for constructing an integrated microchannel cooler device according to one exemplary embodiment of the invention.
Figure 5B:
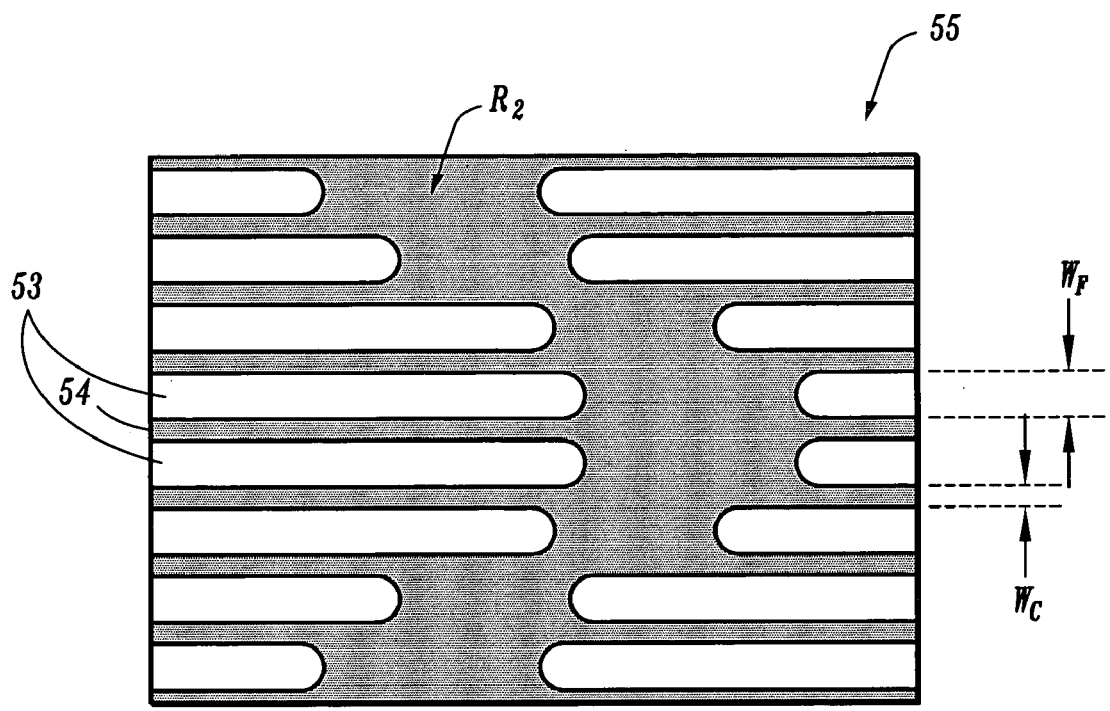

FIGS. 5A and 5B are schematic diagrams illustrating a microchannel plate according to an exemplary embodiment of the invention. More specifically, FIG. 5A is a schematic plan view of a microchannel plate (50) which is compatible for use with the exemplary manifold plate (40) of FIG. 4C, for example. In FIG. 5A, the microchannel plate (50) comprises a substrate (51) (e.g., Si substrate). The substrate (51) comprises a region (52) that is etched (using deep Si etching or other suitable techniques known to those of ordinary skill in the art) to form a plurality of parallel thermal microfins (53) which define microchannels (54) (see FIG. 5B) that extend in the same direction across the region (52). The microchannels (54) comprise a plurality of open-ended slots or grooves of generally rectangular cross-section.

In the exemplary embodiment of FIG. 5A, the microfins (53) are not continuous across the region (52), but are interrupted/discontinuous in such as way as to form recessed regions (R1~R7) which correspond to, and are aligned with, the manifold channels C1~C7 (FIG. 4C) when the manifold plate (40) is bonded to the microchannel plate (50) to form an integrated microchannel cooler device. By way of example, FIG. 5B is a detailed illustration of a portion (55) of the microchannel plate (50) of FIG. 5A, wherein the microfins (53) are discontinuous across the recess region (R2) which corresponds to (aligned with) the manifold channel (M2) of manifold plate (40) (e.g., portion (43) as depicted in FIG. 6). The recessed regions (R1~R7) act as manifolds in conjunction with the corresponding manifold channels (C1~C7) of the manifold plate (40) to increase the area available for the distribution of fluid that flows from the fluid vias (v) to the microchannel (for inlet manifolds) and for the distribution of fluid that flows from the microchannels to the fluid vias (for outlet manifolds). For instance, the portion (43) of the manifold plate depicted in FIG. 6 illustrates a portion of a manifold channel that corresponds to, and can be aligned with, the portion of the recessed region R2 depicted in FIG. 5B. In this regard, the combined area of the manifold channel and recessed regions provides an increased area for fluid flow and distribution.

Moreover, as depicted in FIG. 6, for example, the channel segments (44) of the manifold channel between the fluid vias (v) have varying cross-sectional areas for purposes of reducing pressure drop. More specifically, as depicted in the exemplary embodiments of FIGS. 5B and 6, the channel segments (44) between the input fluid vias (v) of manifold channel (C2) and corresponding portions of the recessed regions (R2) are tapered down away from input fluid vias (v), so as to reduce the cross-sectional area along the coolant path. This results in reduced pressure drop and maintaining the velocity of fluid flow constant, so as to uniformly feed coolant into the microchannels that are disposed along the channel segments.

Furthermore, with the exemplary embodiment depicted in FIG. 5B, the end portion of the microfins (53) along the recessed region (e.g., R2 as shown in FIG. 5B) can be formed with rounded or tapered edges to provide a further reduction in overall system pressure drop. Indeed, the rounded or tapered edges of the microfins (53) results in microchannels (54) having rounded inlet/outlet corners, which reduces the flow resistance by smoothing the incoming/outgoing flow stream.

In one exemplary embodiment of the invention, assume the microfins (53) are formed having a width, $W_F=90$ micron, and define the microchannels (54) having a channel width $W_C=60$ micron and channel depth of 250 micron deep. Further assume that a vertical spacing (Vs) between two adjacent fluid vias (v) (as indicated in FIG. 6) is 0.6 mm, and each via (v) provides coolant to/from a series of microchannels to both the left and right side of the adjacent manifold channel segments (44). Therefore, in this exemplary embodiment, the total cross-sectional area of the microchannels that a single fluid via (v) provides coolant to/from is 1.2 mm×0.25 mm×60% =0.18 mm$^2$ (wherein 1.2 mm=2 Vs and 0.25 mm is the depth of the microchannels. Further assuming (as mentioned previously) that diameter of the fluid via (v) is 0.450 mm (which corresponds to a cross-sectional area of 0.16 mm$^2$), each manifold channel segment (44) has an initial cross-sectional area of 0.450×0.25=0.11 mm$^2$ and provides fluid flow to/from microchannels (54) having a cross-sectional area of 0.09 mm$^2$.

It is to be appreciated that recessed regions (R) to which the manifold channels (C) are aligned also provide additional cross-sectional area for fluid flow. This additional area is provided to reduce the pressure drop caused by the changing direction of the fluid flow as well as the changing geometry of the channel. The microchannels will have more wet perimeter per unit of area than the feeding via (v) and, consequently, there will be an increased pressure drop. The additional volume interconnecting these two structures will allow the fluid flow to find a path of low resistance away from the walls. With a smaller volume, the pressure drop penalty will increase due to the wall friction. As described above, the cross-sectional area of the fluid via (v), the initial cross-sectional area of each manifold channel segment, and the total cross-sectional area of the microchannels to which fluid is provided to or from are all within 25% of their average value.

As noted above, an integrated microchannel cooler device can be formed with the exemplary manifold plate (40) and microchannel plate (50) by bonding the surface (S2) of the manifold plate (40) to the microchannel plate (50) such that the manifold channels (Ci) are aligned with and face the corresponding recessed regions (Ri). More specifically, an integrated microchannel cooler device having an overall size of 20×20 mm with six heat exchanger zones formed between alternating input and output manifolds, as indicated by "I" and "O" in FIG. 4C, and having the manifold/microfin/microchannel dimensions set forth and discussed above, can be constructed using the exemplary plates (40) and (50). Exemplary methods for forming integrated cooler devices and packaging such devices with IC chips will be further explained below with reference to FIGS. 7 and 8, for example.

It is to be appreciated that integrated microchannel cooler devices according to exemplary embodiments of the invention provide efficient and low operating pressure microchannel cooler frameworks which enable effective cooling for electronic devices having very high power densities, and which can be readily manufactured and integrated with the chip packaging, for example. More specifically, various exemplary embodiments of an integrated microchannel cooler devices according to the invention are designed with fluid manifolds, microfins and microchannels that are structured, patterned, dimensioned and/or arranged in a manner, for example, to provide (i) a uniform distribution and flow of coolant fluid and an overall reduction in the system pressure drop, (ii) an increase in manufacturing yields when fabricating a cooler device; and (iii) ease of integration with chip packaging.

More specifically, by way of example, with respect to ease of integration with chip packaging, the use of fluid vias on the back surface of the manifold chip to input/output coolant fluid to/from the integrated microchannel cooler device enables the microchannel cooler device to be dimensioned such that is does not extend significantly beyond the area of the chip being cooled. This is especially advantageous for MCMs, where chips are mounted very close to each other. Moreover, as explained further below, by forming the microfin/microchannel structures in a separate layer (as opposed to forming such structures in the non-active surface of the chip to be cooled), an individual microchannel cooler device can be first constructed and tested, and then thermally bonded to the chips in a manner that enables any yield loss during the cooler fabrication not to result in yield loss of the assembled chip and integrated cooler.

Moreover, with respect to increasing manufacturing yield, the fluid manifolds are designed/structured in such as way as to maintain the structural integrity of the substrate in which the manifolds are formed and minimize the potential of breakage of the substrate. Indeed, as explained with reference to the exemplary manifold plate (40), the manifolds (Mi) are not formed with continuous elongated slots for providing the coolant flow (as in conventional designs), but rather with a series of circular openings, or openings with rounded corners, arranged in a zig-zag pattern, to reduce wafer cracking during manufacturing, and with manifold channels formed between the circular openings on the plate surface that faces the microchannels. These manifold structures reduce the potential of wafer breakage by using circular openings to minimize stress concentrations which can serve as crack nucleation sites, minimizing the total cavity area of the channel manifolds by using the recessed regions of the microchannel pattern to act as a manifold in conjunction with the manifold channels, and avoid aligning the cavities along the (100) Si cleavage planes.

Furthermore, integrated microchannel cooler devices according to exemplary embodiments of the invention may implement various mechanisms for achieving uniformity of the distribution and flow of coolant fluid and an overall reduction in the system pressure drop. For instance, one method that is implemented for reducing the pressure drop is subdividing the coolant flow into multiple heat exchanger zones so that the flow paths through the microchannels are short. More specifically, by way of example, the exemplary manifold and microchannel plate embodiments discussed above, provide multiple input and output fluid manifolds (Mi) for defining multiple heat exchanger zones. Indeed, as depicted in the exemplary microchannel plate (50) of FIG. 5A and manifold plate (40) in FIG. 4C, six heat exchanger zones are defined by alternating input and output manifolds, wherein each input manifold (M2, M4 and M6) feeds two zones of microchannels that end at output manifolds (M1, M3, M5 and M7). Further, the ziz-zag manifold structures enable the formation of multiple manifolds while maintaining the structural integrity of the chip.

Another method for reducing pressure drop is to design the manifolds such that each manifold channel has an initial, or final, cross-sectional area that is at least equal to a total cross-sectional area of all microchannels that receive coolant fluid from the manifold channel, or that supply coolant fluid to the manifold channel. For instance, in the exemplary embodiments of FIG. 4C and FIG. 5A, the input manifold channels C2, C4 and C6 each feed two zones of microchannels. As such, the initial cross-sectional area of each of the input manifold channels should be at least as large as the sum of the microchannel cross-sections that are fed by such channels. Moreover, the output manifold channels C3 and C5 each received coolant fluid from 2 zones of microchannels. As such, the final cross-sectional area of output manifold channels C3 and C5 should be at least as large as the sum of the microchannel cross-sections that feed such manifold channels (or, in the exemplary embodiment, the cross-sectional area of each manifold channel C2~C6 should be the same). On the other hand, the output manifold channels C1 and C7 are each fed by one zone of microchannels. As such, the final cross-sectional area of each output manifold channel C1 and C7 should be no less than one-half the initial cross-sectional area of the input manifold channels (M2 and M6).

Similarly, another method for reducing pressure drop is to design the manifolds such that the fluid vias for each manifold have a total cross-sectional area that is at least equal to the total cross-sectional area of all microchannels that receive coolant fluid supplied through the fluid vias or that supply coolant fluid which is output from the fluid vias. For instance, the fluid vias for via pattern V4 should have a total cross-sectional area at least equal to the sum of the cross-sectional area of the microchannels that are fed by the corresponding manifold channel C4.

Moreover, as noted above, another manifold design feature for reducing pressure drop is to vary the cross-sectional area of the manifold channels to uniformly feed coolant fluid to the microchannels. For instance, as depicted in the exemplary embodiments of FIGS. 5B and 6, the channel segments (44) between the input fluid vias (v) of manifold channel (C2) and corresponding portions of the recessed regions (R2) are tapered down away from input fluid vias (v), to as to reduce the cross-sectional area along the coolant path. This results in reduced pressure drop and maintaining the velocity of fluid flow constant, so as to uniformly feed coolant into the microchannels that are disposed along the channel segments. Moreover, the pressure drop can be further reduced by rounding or tapering the microchannel inlet corners which reduces the flow resistance by smoothing the incoming flow.

Overall, an integrated microchannel cooler device according to the invention, which is formed from the exemplary manifold and microchannel plates (40) and (50), provides a multi-heat exchanger zone structure in which all the heat exchanger zones are connected in parallel, which means that the heat exchanger zones are uniformly designed (e.g., the microchannel pattern is the same (continues channels with same pitch) in all heat exchanger zones, and the alternating input and output manifolds are equally spaced so that microchannel lengths are substantially the same for all heat exchanger zones) to operate with the same pressure drop between the inlet and outlet manifolds, and the manifolds are designed with variable cross-sectional areas so as to ensure that for a given heat exchanger zone, there is a uniform distribution of coolant across the heat exchanger zone. In this manner, the integrated microchannel cooler can be designed with a sufficient number of parallel heat exchanger zones and flow pressures based on an expected average power density of a chip, to provide a flow per unit width and pressure drop per unit length that is sufficient to effectively cool the chip with such average power density.

Figure 7:
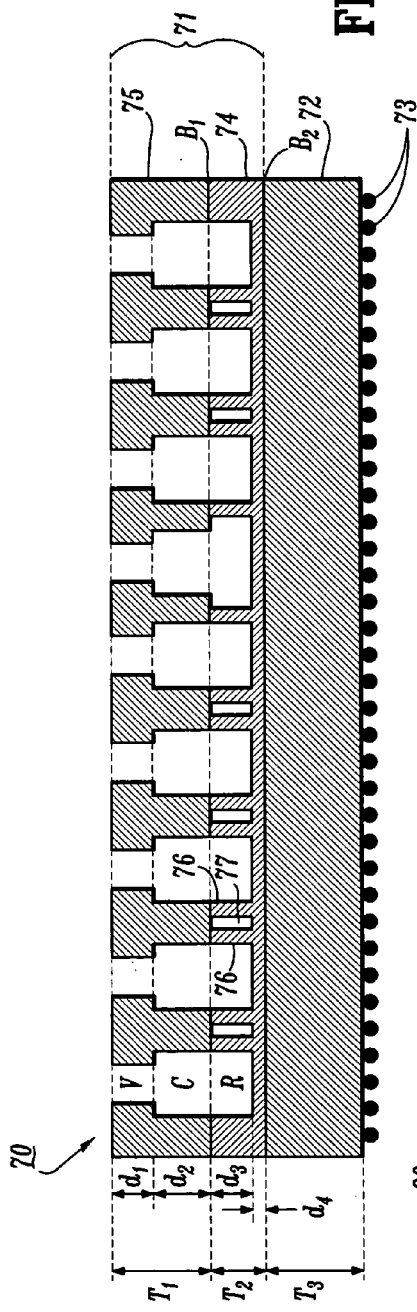
FIG. 7 is a schematic cross-sectional diagram illustrating an apparatus for microchannel cooling a semiconductor chip according to an exemplary embodiment of the invention.

FIG. 7 is a schematic diagram of an apparatus for cooling an a semiconductor chip according to an exemplary embodiment of the invention. More specifically, FIG. 7 schematically illustrates a cross-sectional side-view of a semiconductor package (70) according to an exemplary embodiment of the invention, which comprises an integrated microchannel cooler device (71) that is thermally coupled to the back (non-active) surface of a semiconductor chip (72) (e.g., processor chip) via a thermal bond (B2). The active surface of the chip (72) comprises a plurality of solder balls (C4s) for flip-chip bonding to a package substrate.

The microchannel cooler device (71) comprises a microchannel plate (74) and manifold plate (75) that are joined via a bond (B1), and the plates (74) and (75) can have manifold and microchannel structures similar to those discussed above with respect to FIGS. 4A–4D and 5A–5B. In this regard, the exemplary embodiment of FIG. 7 may be considered a cross-sectional view along a longitudinal line which: (i) extends in a direction parallel to a zig-zag shaped fluid manifold structure formed in the manifold plate (75) and orthogonal to a plurality of thermal microfins (76) and microchannels (77) of the microchannel plate (74); and which (ii) passes through the center of each of a plurality of fluid vias (v) formed on one side of the zig-zag shaped fluid manifold structure. As depicted in FIG. 7, the fluid vias (v) form openings at points along the manifold channel (C), and the microchannel plate (74) comprises a plurality of regions (R) in which the thermal microfins (76) are discontinued. The plurality of thermal microfins (76) and channels (77) extend in parallel in a direction orthogonal to the plane of the drawing sheet.

The bond (B1) between the manifold plate (75) and the microchannel plate (74) is sufficient to provide a watertight seal, but the bond (B1) does not have to provide a low thermal resistance. Accordingly, bonding methods such as direct wafer bonding, fusion bonding, anodic bonding, glass frit bonding, solder bonding, polymer adhesive bonding, or any other suitable bonding method may be used to join the microchannel and manifold plates (74) and (75). Moreover, the bond (B2) between the microchannel plate (74) and the chip (72) should be formed using a low thermal resistance bond, to thereby allow sufficient heat conduction from the chip (72) to the microchannel plate (74). A low thermal resistance bond such as a metal joint, solder joint, or a filled thermal adhesive such as a Ag epoxy, or other joining means could be used, as long as the bonding thickness is sufficiently thin and compatible with the level of cooling flux required. It is desirable that the thermal resistance of the low thermal resistance bond be less than 0.2C-cm²/W, or preferably, less than or equal to 0.1 C-cm²/W. Further, it is desirable that the bond (B2) be reworkable, so that the microchannel cooler (71) can be removed from the chip (72), when necessary, to either replace the individual cooler device (71) or replace the chip (72). Accordingly, a solder join can be reworked and if a solder layer is in contact with an Ag epoxy joint, it can also be reworked.

The dimensions of the manifold plate (75), such as thickness $T_1$, and the dimensions of the manifold structures, such as the depth $d_1$ of the fluid vias (v) and the depth $d_2$ of the manifold channels (C), can be the same as those described above with respect to FIG. 4D. Moreover, recess depth $d_3$ of the microchannels (77) can be the same as described above with respect to FIG. 5A~B. However, in another exemplary embodiment of the invention, the thickness $T_2$ of the microchannel plate (74) can be reduced (from the typical silicon wafer thickness of 0.75 mm) using various methods to minimize the distance $d_4$ to reduce the temperature drop through the silicon thickness, thereby increasing thermal performance of the package (70). For instance, in one embodiment, the thickness $T_2$ can be reduced from the typical thickness of 0.75 mm for a 200 or 300 mm diameter silicon wafer such that the distance $d_4$ is about 100 micron.

Various methods may be employed for constructing the package structure (70) of FIG. 7. In general, in one embodiment of the invention, the microchannel plate (74) and the manifold chip (75) can be bonded to each other and tested, and then thermally bonded to the back of the chip (72) with the microchannel plate (74) in contact with the back surface of the chip (72). More specifically, in one exemplary embodiment of the invention, at the wafer level, a first wafer comprising a plurality of microchannel plates formed therein can be bonded to a second wafer containing a plurality of corresponding manifold plates. The bonded wafers can then be subjected to polishing, grinding, and/or lapping to thin down the substrate on which the microchannel plates are fabricated. Alternatively, the wafer containing the plurality of microchannel plates can first be thinned prior to bonding or dicing. With the two wafers bonded together, the wafers can be diced to separate out the individual microchannel cooler devices. Alternately, the wafers containing the microchannel and manifold plates can be polished, diced, etc., and then individual microchannel cooler devices can be formed by bonding the individual manifold and microchannel plates. Note that outside dimensions of microchannel cooler (71) in FIG. 7 can be slightly greater than the outside dimensions of chip (72) so that microchannel cooler (71) extends beyond chip (72) slight on each side. Such a slight extension can improve the performance because the perimeter region where manifold plate (75) and microchannel plate (74) are joined together provide reduced cooling compared to the interior regions of microchannel cooler (71). The slight extension allows the entire back surface of chip (72) to be in contact with the interior regions of microchannel cooler (71) which contain microchannels.

In another exemplary embodiment of the invention, the thermal performance of the package structure (70) of FIG. 7 can be further improved by thinning the substrate of the chip (72), in addition to reducing the thickness of the substrate material remaining beneath the microchannels (77) in the microchannel plate (74). For example, as noted above, the surface of the microchannel plate (74) which is bonded to the chip (72) can be polished to have only about 100 micron of Si present below the deepest etched regions on the microchannel plate. Further, the thickness $T_3$ of the chip (72), e.g., processor chip, may be reduced to about 0.3 mm from an initial Si wafer thickness of about 0.75 mm.

The exemplary microchannel cooler device embodiments described above, such as in FIG. 7, include integrated microchannel cooler devices that are formed by joining separate manifold and microchannel plates. In other embodiments of the invention, an integrated microchannel cooler device comprises a single plate that is constructed with both microchannels and supply/return manifolds structures. For example, FIGS. 8A and 8B are schematic diagrams illustrating an apparatus (80) for cooling a semiconductor chip according to another exemplary embodiment of the invention, which includes an integrated microchannel cooler (81) that is thermally bonded to the non-active surface of a semiconductor chip (82) which can be flip-chip bonded to a package substrate via solder balls (83).

Figure 8A:
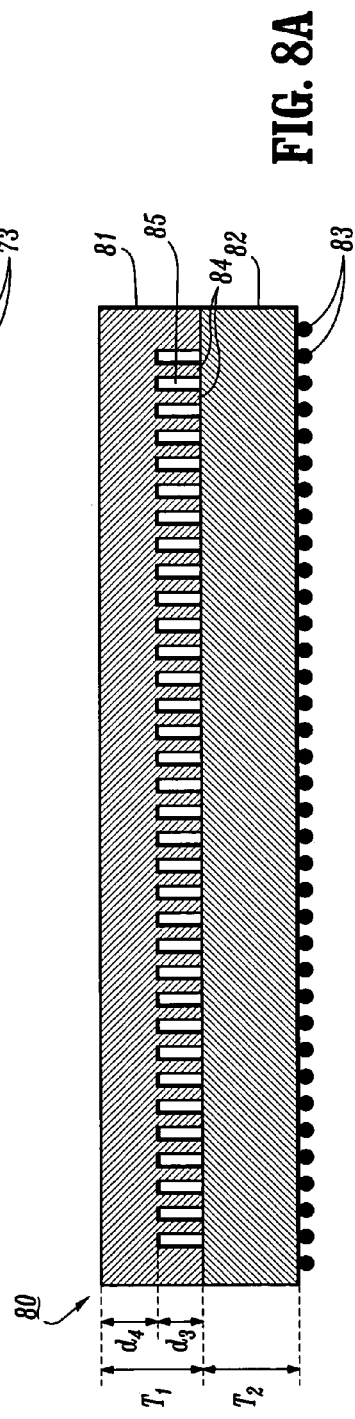
FIGS. 8A~8B are schematic cross-sectional diagrams illustrating an apparatus for microchannel cooling a semiconductor chip according to another exemplary embodiment of the invention.

More specifically, FIG. 8A schematically illustrates a cross-sectional view of an IC package structure (80) taken along a longitudinal line which extends in a direction orthogonal to a plurality of thermal microfins (84) and microchannels (85) in a heat exchanger zone of the cooler (81). Further, FIG. 8B schematically illustrates a cross-sectional view along a longitudinal line which (i) extends in a direction parallel to a zig-zag shaped fluid manifold structure formed at an end portion of the heat exchanger zone in the integrated cooler (81), and which (ii) passes through the center of each of a plurality of fluid vias (v) formed on one side of the zig-zag shaped fluid manifold structure.

Figure 8B:
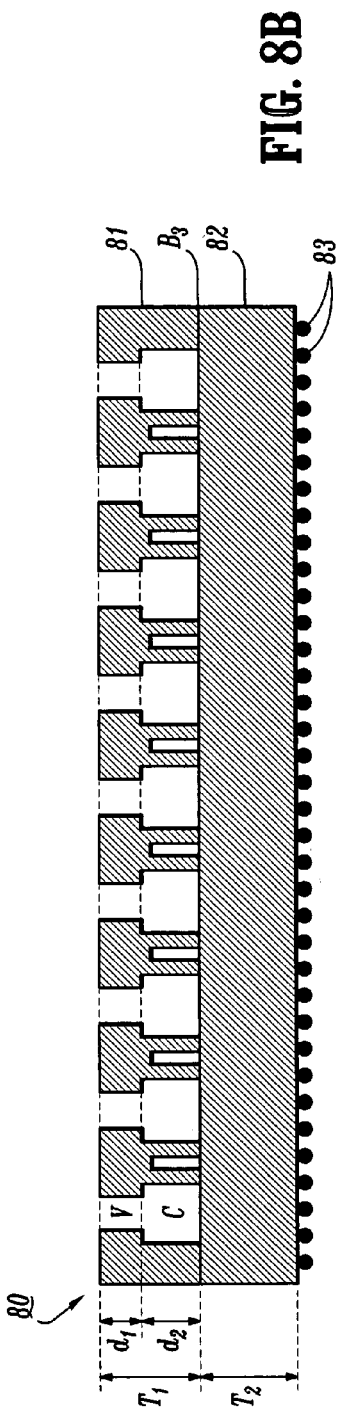

In other words, the integrated microchannel cooler device (81) framework depicted in FIGS. 8A and 8B, combines the functions and structures of the microchannel plate and the manifold plate in one substrate layer. The exemplary microchannel cooler device (81) can be formed by etching the via patterns as discussed above to form the fluid vias (v) to a depth $d_1$ on one surface of the cooler substrate (81). Then, one or more dry etching steps could be used to form the manifold channels (C) and the thermal microfins (84) and microchannels (85). If the manifold channels (C) are formed to have the same depth as the microchannels (85), i.e., $d_2=d_3$, the manifold channels (C) and microchannels (85) can be formed with the same dry etching step. Alternately, the manifold channels and microchannels could be formed by two separate and independent dry etch steps or a combination of two dry etch steps.

In the exemplary embodiment of FIGS. 8A and 8B, the manifold channels (C) are depicted as being deeper than the microchannels (85) ($d_2>d_3$). In such embodiment, two dry etch steps can be used to form deeper manifold channels (C) (which are deeper than the microchannels (85) by more than that which would result from RIE lag—wider features etch faster than narrower features). With this configuration, the fabrication process can be simpler and the performance can potentially be improved due to the direct contact of the cooling fluid to the chip (82). Moreover, the thermal microfins (84) fins are joined to the chip (82) using a low thermal resistant bond (B3). It is to be noted that with this design, the interior region of the microchannel cooler device (81) containing microchannels is smaller than the chip (82), because a perimeter region is needed to seal the two together. Note that a hermetic bonding method is needed in the perimeter region to form the seal.

Figure 9B:
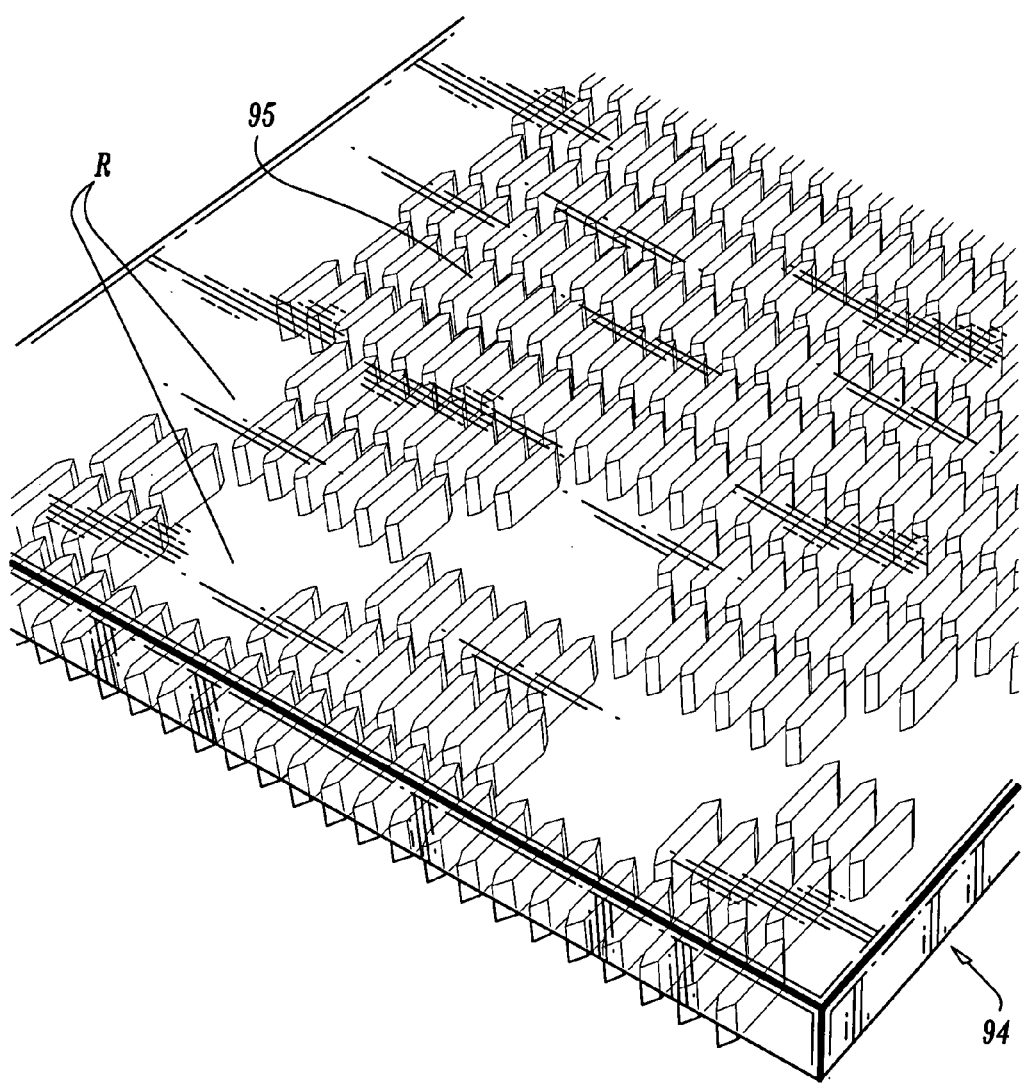
Figure 9C:
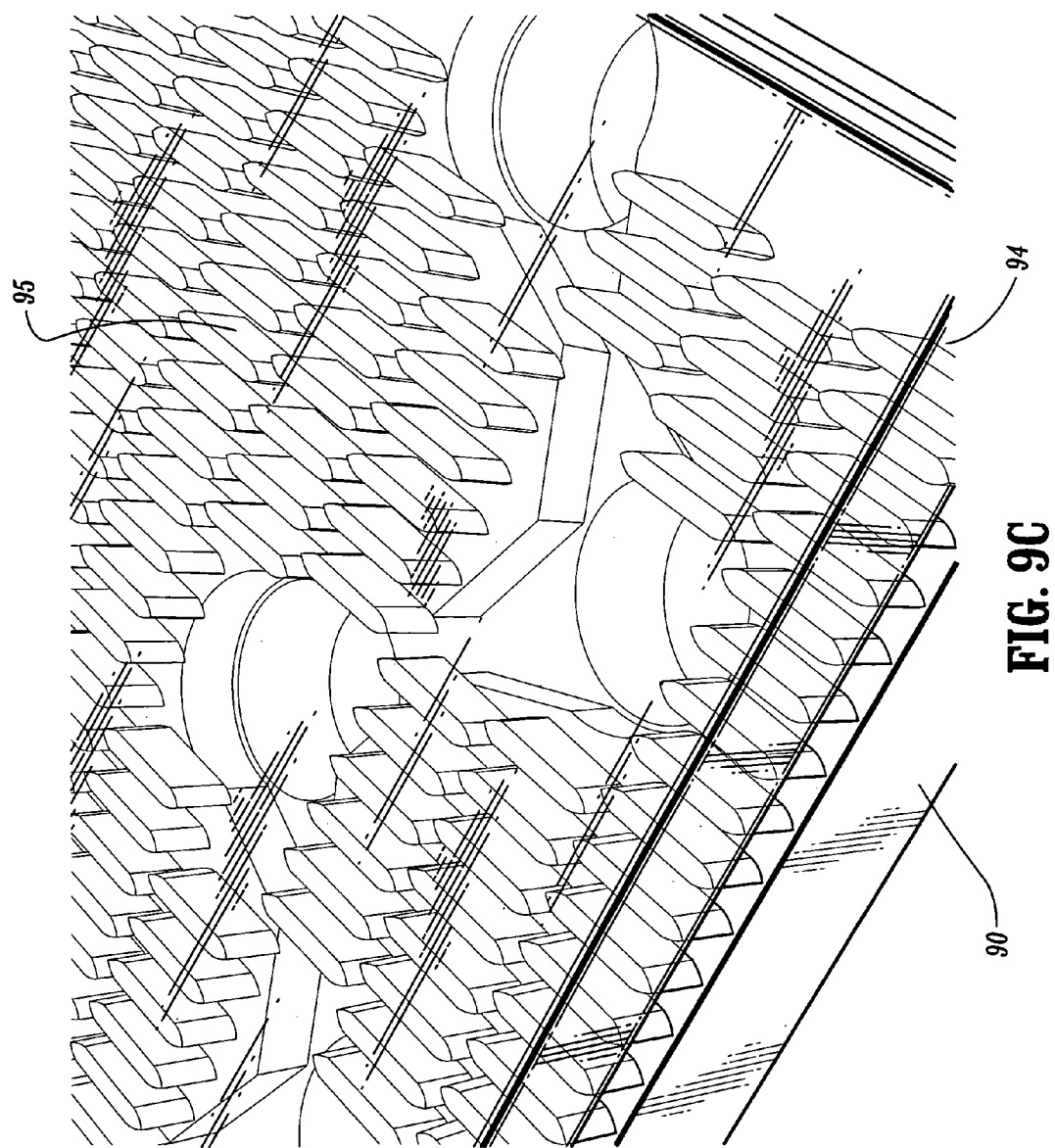

FIGS. 9A~9C are schematic perspective views of an integrated microchannel cooler device according to another exemplary embodiment of the invention. More specifically, as described above, FIG. 9A depicts a three-dimensional perspective view of a portion of manifold plate (90) having a fluid manifold (91), which comprises a manifold channel (92) formed in a zig-zag pattern and a plurality of fluid vias (v) that form openings to the manifold channel (92). The channel segments (93) of the manifold channel (92) formed between the fluid vias (v) are tapered.

FIG. 9B depicts a three-dimensional perspective view of a portion of a microchannel plate (94), which can be bonded to the manifold plate (90) of FIG. 9A to form an integrated microchannel cooler apparatus as depicted in FIG. 9C. FIG. 9B is a perspective view of the microchannel plate (94) as viewed from the top where for clarity, the substrate is shown as semitransparent solid, illustrating a plurality of thermal microfins (95) formed on a bottom surface of the substrate in a staggered pattern. As compared to the exemplary embodiments above wherein the microchannels are continuous in each heat exchanger zone between manifolds, the staggered microfin pattern depicted in FIG. 9B can be used to increase the heat transfer (compared to continuous fins) by having each fin segment shed the boundary layer, so a new boundary layer is formed for each fin segment. This design also allows transverse mixing (between channels); such a structure helps prevent catastrophic failure due to channel clogging and provides an additional mechanism to improve flow uniformity within the microfin region. Moreover, as discussed below, a staggered thermal microfin pattern can be used to provide increased cooling capacity for chip "hot spot" regions.

FIG. 9C is depicts a perspective view of a portion of an integrated microchannel cooler module that is formed by bonding the manifold plate (90) of FIG. 9A and the microchannel plate (94) of FIG. 9B. In particular, FIG. 9C is a perspective view as viewed from the top surface of the microchannel plate substrate (94), which is shown as semitransparent solid for illustrative purposes, wherein the thermal microfins (95) pattern is discontinued in the regions R that are aligned along the manifold channel (92).

In other exemplary embodiments of the invention, microchannel cooling apparatus include fluid distribution manifolds for SCM and MCM packages, which are connected to separate integrated microchannel cooler devices that are bonded to the back surfaces of chips that are flip-chip bonded to a substrate, for delivering coolant fluid to/from integrated microchannel cooler devices. High performance chips, e.g., processors, are typically mounted face down to a packaging substrate, made from a ceramic or organic material and containing multiple wiring layers, using an area array of microsolder balls such as C4's. In a multichip module (MCM), many chips are mounted on a common substrate and with a single chip module (SCM) only one chip is attached to the substrate. The ceramic substrate provides a space transformation between the fine pitch (~200 micron) C4s and the more coarse pitch electrical connections between the $1^{st}$ level package substrate and the printed circuit board, or $2^{nd}$ level package, which are about 1 mm apart. One common means of providing electrical connection between a $1^{st}$ and a $2^{nd}$ level package is a land grid array (LGA) which requires a significant compression force to be applied to actuate the LGA.

Figure 10:
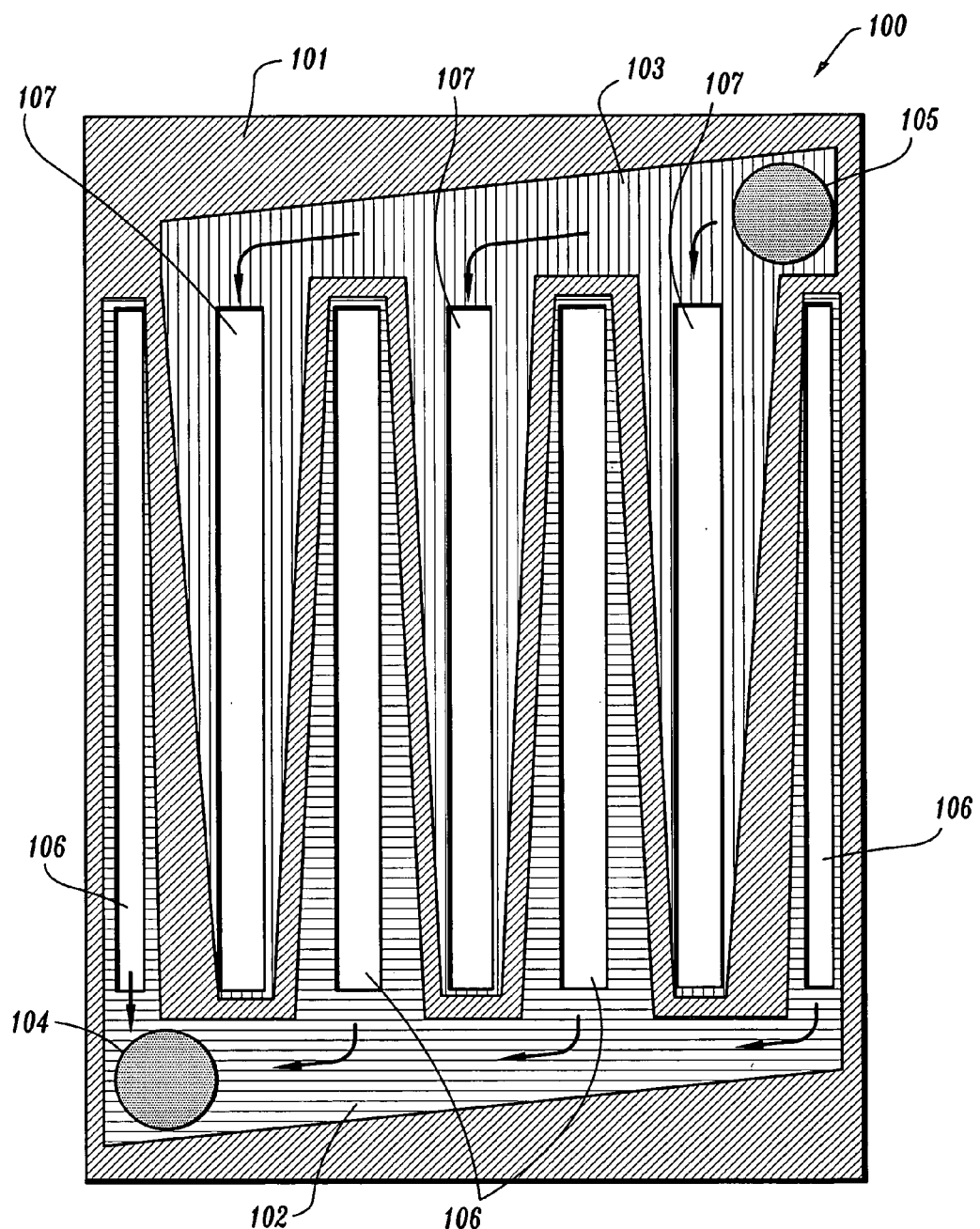
FIG. 10 is a schematic plan view of a fluid distribution manifold device according to an exemplary embodiment of the invention.
Figure 11:
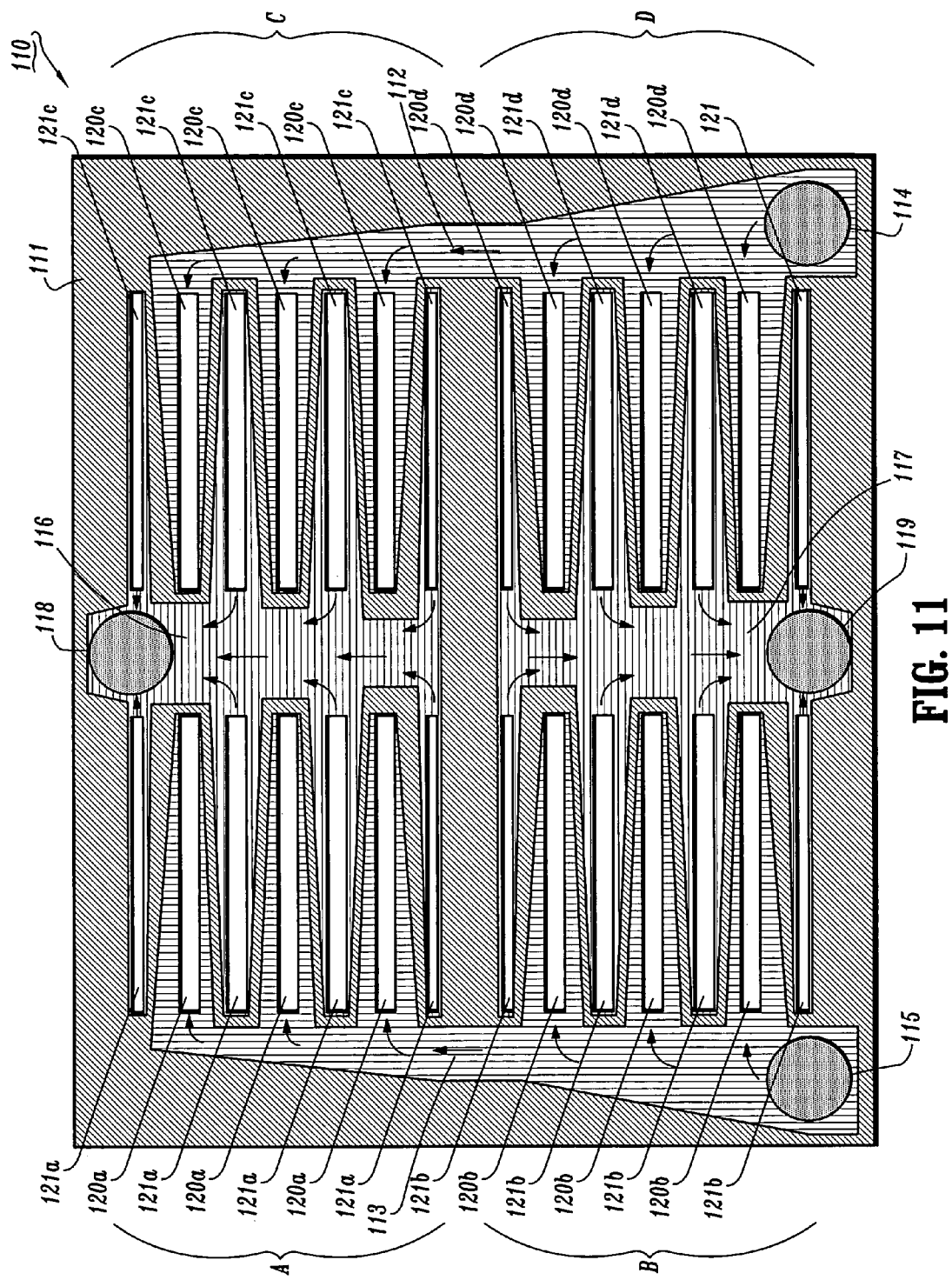
FIG. 11 is a schematic plan view of a fluid distribution manifold device according to another exemplary embodiment of the invention.

FIGS. 10 and 11 are schematic diagrams illustrating fluid distribution manifolds according to exemplary embodiments of the invention, which can be implemented for SCM and MCM chip packages. The exemplary fluid distribution manifolds are designed in a manner to minimize overall system pressure drop by using variable cross-sectional fluid supply/return channels for delivering coolant fluid to/from integrated microchannel cooler devices. Moreover, exemplary embodiments of the invention implement connection mechanisms that provide mechanical decoupling between the fluid distribution manifolds and the integrated microchannel cooler devices to prevent excess stress on the C4's which attach the chips to the package substrate. More specifically, for purposes of providing mechanical compliance when a fluid distribution manifold is secured to a microchannel cooler, a mechanically compliant gasket/seal is provided between the fluid distribution manifold and a microchannel cooler to seal the junction between such components. The mechanically compliant gasket comprises any suitable compressible material, such as elastomer, or any other suitable material that can be compress when coupling the coolant deliver manifold to the microchannel structure may be securely made while tolerating differences in height of the integrated circuit chips, and without requiring large pressures which can damage the chips. The compliant gasket material may also be adhered or bonded to the microchannel cooler and the fluid distribution manifold so that it need not be maintained in a compressed state to form a fluid seal.

By way of example, FIG. 10 is a schematic plan view of a fluid distribution manifold device according to an exemplary embodiment of the invention, which can be used with an integrated microchannel cooler device formed with the above-described exemplary manifold plate (40) for a single chip module (SCM). More specifically, FIG. 10 illustrates an exemplary fluid distribution manifold (100) comprising a housing (101) having a fluid return manifold (102) and fluid supply manifold (103) cut or formed therein. The fluid return manifold (102) comprises a plurality of flow channels indicated by the horizontal cross-hatched regions, and the fluid supply manifold (103) comprises a plurality of flow channels indicated by the vertical cross-hatched regions. Further, circular regions (104) and (105) indicate where output and input ports would be made in a cover plate (not shown) secured to the housing (101) to provide the fluid supply/return connections to the fluid distribution manifold (100).

The manifold (100) includes a plurality of elongated rectangular openings (106) and (107) on the bottom surface of the housing (101), which are coupled to fluid vias (v) of corresponding manifolds (Mi) on the manifold plate (40) in FIG. 4C with a mechanically compliant gasket. For example, in the exemplary embodiment, the rectangular openings (107) are aligned with and coupled to the fluid vias of the input manifolds M2, M4, and M6 to supply coolant fluid into the microchannel cooler device and the rectangular openings (106) are aligned with and coupled to the fluid vias of the output manifolds M1, M3, M5 and M7 for receiving heated fluid that is returned from the microchannel cooler device.

Moreover, as depicted in FIG. 10, the manifolds (102) and (103) are formed with variable cross section channels to maintain the velocity of the fluid flow near constant and reduce dynamic pressure drop. For instance, the cross-sectional area of the flow channel of the supply manifold (103) that is aligned with the inlet port (105) is tapered to provide uniform distribution of the input coolant fluid to each of the flow channels which feed the rectangular openings (107). Further, the flow channels which feed the rectangular openings (107) are also tapered to reduce the cross-section area to uniformly supply coolant fluid to the input fluid vias along the input manifolds of the integrated microchannel cooler connected thereto. Similarly, the various flow channels that form the return manifold (102) are designed with variable cross-sectional area to reduce dynamic pressure drops for the return fluid received from the output manifolds of the integrated microchannel cooler attached thereto. For instance, the cross-sectional area of the flow channel of the supply manifold (102) that is aligned with the output port (105) is tapered to provide uniform redistribution of the output coolant fluid that flows from each flow channel having the rectangular openings (106). Moreover, the flow channels which receive return fluid from the rectangular openings (106) are also tapered to reduce the cross-section area to provide a uniform flow and redistribution of coolant fluid that is received from the outlet fluid vias along the output manifolds of the integrated microchannel cooler connected thereto.

It is to be appreciated that the cross-sectional areas of the supply/return manifold segments can also be varied by varying the recess depths of such segments, in addition to or in lieu of, varying the channel widths such as shown in FIG. 10. In all instances, the area of the flow channels are decreased sufficiently to reduce the dynamic pressure drop by maintaining the velocity of the coolant fluid substantially, or very close to, constant along the flow channels in the fluid distribution manifold device (100). Moreover, although not specifically shown, a further reduction ins pressure drop can be obtained by rounding the corners of the flow channels of the input and output manifolds (102) and (103) to reduce the resistance to flow.

The fluid distribution manifold can be formed of any suitable corrosion resistant material, such as copper or plastic or other material, in which the flow channels of the input and output manifolds can be milled, drilled, molded, or otherwise formed in a block of such material. The fluid distribution manifold (100) should be of sufficient dimensions with larger variable cross-sections to properly feed inlet and outlet manifolds of the integrated microchannels cooler device connected thereto. This particular larger variable cross-section manifold can not be machined into the manifold plate, mainly because of geometrical constraints which require the additional cross-section area to be formed with higher vertical dimensions, which can not be achieved using a thin plate such as a silicon wafer.

FIG. 11 is a schematic plan view of a fluid distribution manifold device according to another exemplary embodiment of the invention. In particular, FIG. 11 depicts a common fluid distribution manifold (110) which can be implemented with a multi-chip module (MCM) that comprises an array of four flip-chip bonded chips, wherein each chip has a separate integrated microchannel cooler device attached thereto, which is formed with the exemplary manifold plate (40) as depicted in FIG. 4C. The exemplary fluid distribution manifold (110) comprises a housing (111) having two fluid supply manifolds (112) and (113), which are supplied with coolant fluid from respective inlets (114) and (115) formed in a cover plate (not shown), as well as two fluid return manifolds (116) and (117), which output fluid to respective outlet ports (118) and (119) formed in the manifold cover. The exemplary fluid distribution manifold (110) comprises four manifold sections (A, B, C and D), which are similar in structure to the fluid distribution manifold structure (100) of FIG. 10.

The fluid supply manifolds (112) and (113) comprise a plurality of flow channels indicated by the vertical cross-hatched areas, which are cut or formed in the housing (111). The fluid supply manifold (113) supplies coolant fluid to 2 integrated microchannel coolers connected to manifold sections A and B and the fluid supply manifold (112) supplies coolant fluid to 2 integrated microchannel coolers connected to manifold sections C and D. More specifically, the fluid supply manifold (113) comprises flow channel regions having a plurality of rectangular openings (120a) that are aligned with the fluid vias of corresponding input manifolds of a first microchannel cooler device coupled to the manifold section A, as well as flow channel regions having a plurality of rectangular openings (120b) that are aligned with the fluid vias of corresponding input manifolds of second microchannel cooler device coupled to the manifold section B. Similarly, the fluid supply manifold (112) comprises flow channel regions having a plurality of rectangular openings (120c) that are aligned with the fluid vias of corresponding input manifolds of a third microchannel cooler device coupled to the manifold section C, as well as flow channel regions having a plurality of rectangular openings (120d) that are aligned with the fluid vias of corresponding input manifolds of a fourth microchannel cooler device coupled to the manifold section D.

The fluid return manifolds (116) and (117) comprise a plurality of flow channels indicated by the horizontal cross-hatched areas, which are cut or formed in the housing (111). The fluid return manifold (116) receives coolant fluid returned from 2 integrated microchannel coolers connected to manifold sections A and C and the fluid return manifold (117) receives coolant fluid returned from two integrated microchannel coolers connected to manifold sections B and D. More specifically, the fluid return manifold (116) comprises flow channel regions having a plurality of rectangular openings (121a) that are aligned with the fluid vias of corresponding output manifolds of the first microchannel cooler device coupled to the manifold section A, as well as flow channel regions having a plurality of rectangular openings (121c) that are aligned with the fluid vias of corresponding output manifolds of the third microchannel cooler device coupled to the manifold section C. Similarly, the fluid return manifold (117) comprises flow channel regions having a plurality of rectangular openings (121b) that are aligned with the fluid vias of corresponding output manifolds of the second microchannel cooler device coupled to the manifold section B, as well as flow channel regions having a plurality of rectangular openings (121d) that are aligned with the fluid vias of corresponding output manifolds of the fourth microchannel cooler device coupled to the manifold section D.

Therefore, as described above, a fluid distribution system according to an exemplary embodiment of the invention, which can be used for implementing a microchannel cooling apparatus, comprises a fluid distribution manifold block (e.g., 100 or 110) coupled with a compliant gasket to a manifold plate (e.g., manifold plate (40)) of one or more microchannel cooler devices, where at least the distribution manifold block and the manifold plate have variable cross-sections (i.e. tapered) flow channels. The compliant gasket may or may not contain variable cross-section flow channels.

In other exemplary embodiments of the invention, various methods may be implemented for custom designing microchannel cooler devices to provide localized cooling capacity for one or more "hot spot" regions of a chip (regions with higher than average power density). More specifically, for chips having a non-uniform power density distribution (non-uniform power map), an integrated microchannel cooler device according to the invention can be custom designed by providing manifold and microchannel structures, patterns, arrangements, etc., which enable increased localized cooling capacity for chip hot spots. The manner in which such integrated microchannel cooler devices can be custom designed will vary depending on factors such as the size, magnitude, and/or number of hot spot regions of a chip. Various exemplary methods according to the invention for designing microchannel cooler devices to provide increased localized cooling capacity for chip hot spot regions will now be discussed with reference to FIGS. 12–16 and 17A~B).

Figure 12:
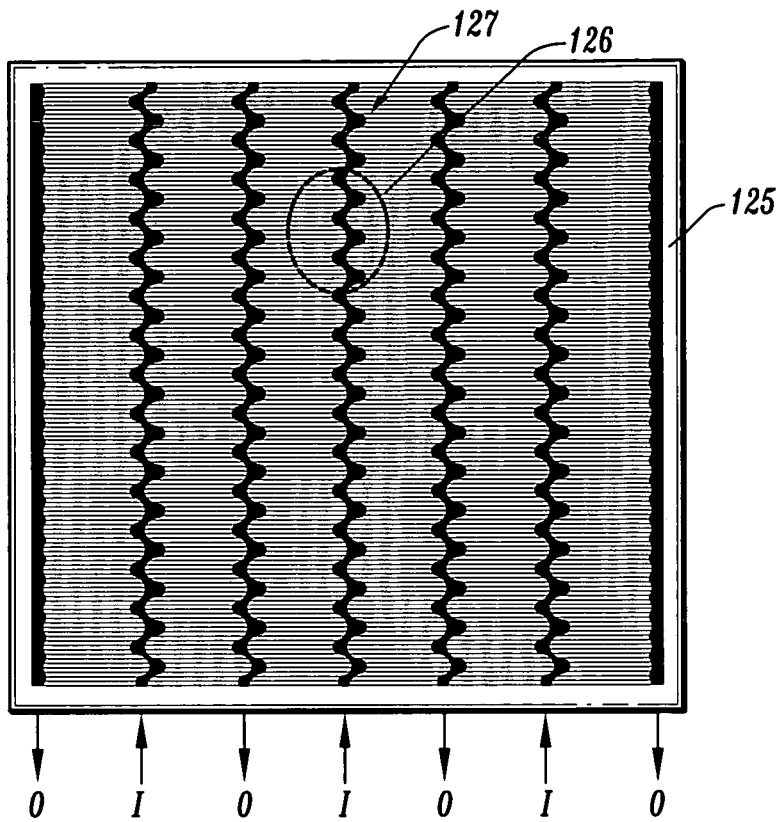
FIG. 12 is a diagram that schematically illustrates a method for providing a locally increased cooling capacity for a "hot spot" region of a chip according to an exemplary embodiment of the invention.

FIG. 12 schematically illustrates a method for designing an integrated microchannel cooler device to provide a locally increased cooling capacity for a "hot spot" region of a chip, according to one exemplary embodiment of the invention. In general, FIG. 12 illustrates an exemplary design method in which an integrated microchannel cooler device can be designed with a uniform structure that provides uniform cooling which is sufficient for an expected average power density of a chip, while at the same time providing an increased localized cooling capacity for a "hot spot" region of a chip. More specifically, FIG. 12 depicts an exemplary microchannel plate (125) having a uniform, multi-zone heat exchanger structure (similar to that shown in FIG. 5B), wherein a region (126) corresponds to a "hot spot" region of a chip. As discussed above, the exemplary uniform microchannel framework (uniform microchannel patterns and evenly spaced I/O manifolds) enables a uniform fluid flow across all heat exchanger zones and provides uniform cooling over the surface of the chip.

Assuming the microchannel plate (125) is designed to provide uniform cooling capability for the expected average power density of the chip, as depicted in FIG. 12, an increased localized cooling for the hot spot region (126) of the chip is obtained by designing the microchannel plate (125) to have an input fluid manifold (127) that is aligned to the hot spot region (126) of the chip. The exemplary method of FIG. 12 can be used to provide increased localized cooling of the "hot spot" region (126) of the chip when, for instance, the "hot spot" region (126) has a relatively small area with a modest increased power density as compared to the average power density of the chip for which the microchannel cooler is designed. This is because in a typical microchannel cooler design, there can be a significant increase in fluid temperature, up to about 10° C. depending on the cooling fluid and the configuration, along the length of the microchannels. Therefore, with the exemplary method of FIG. 12, the "hot spot" temperature can be reduced by approximately the amount of temperature gained by the fluid flowing along the channels. In addition, the exemplary method of FIG. 12 provides an arrangement in which the central portion/axis of the hot spot region (126) is aligned with the entrance of microchannels where the local heat transfer coefficient is higher than in the rest of the channel lengths, which effectively provide increased localized cooling for the hot spot (126).

In general, it should be noted that a uniform microchannel cooler structure providing uniform cooling capability, such as depicted in FIGS. 12 and 5B, may be used for cooling a chip having a "hot spot" region, whereby the microchannel cooler is designed to provide uniform cooling for an expected higher than average power density of the "hot spot". However, this "uniform" design method may be inefficient for cooling a chips with "hot spot" regions because the required water flows and pressure drops are increased over an optimum design. Indeed, a "high performance" microchannel patterns (e.g., fine-pitched microchannels, or microchannels defined by staggered or interrupted microfins (e.g., FIGS. 17A~B), with a high fluid flow) may be needed to adequately cool a "hot spot", but such patterns result in a large pressure drops.

Therefore, a more optimum microchannel cooler design would be to provide "high performance" microchannel patterns for chip "hot spots" having a greater than average power density, while using a lower performance microchannel pattern (e.g., use a less fine microchannel pitch and a lower flow rate design) for the regions of the chip with reduced power densities (e.g., average power density). With such methods, the structure of the microchannel cooler device is not "uniform", but contains regions which under the same operating conditions (i.e., same total pressure drop for each heat exchanger section) as surrounding regions provide, are able to cool higher power densities and are aligned with hot spot regions on the chip. In other words, an integrated microchannel cooler device can be custom designed for a given chip based on a power map (power density distribution) of the chip by varying the microchannel performance in the same and/or different heat exchanger zones to match the (non-uniform) power map of the chip. Various methods according to the invention in which the microchannel performance is varied to provide increased local cooling capacity for chips having large hot spots and/or hot spots with a significantly higher power density as compared to the average power density of the chip, will be now be described with reference to the exemplary embodiments of FIGS. 13–16 and 17A~B.

Figure 13:
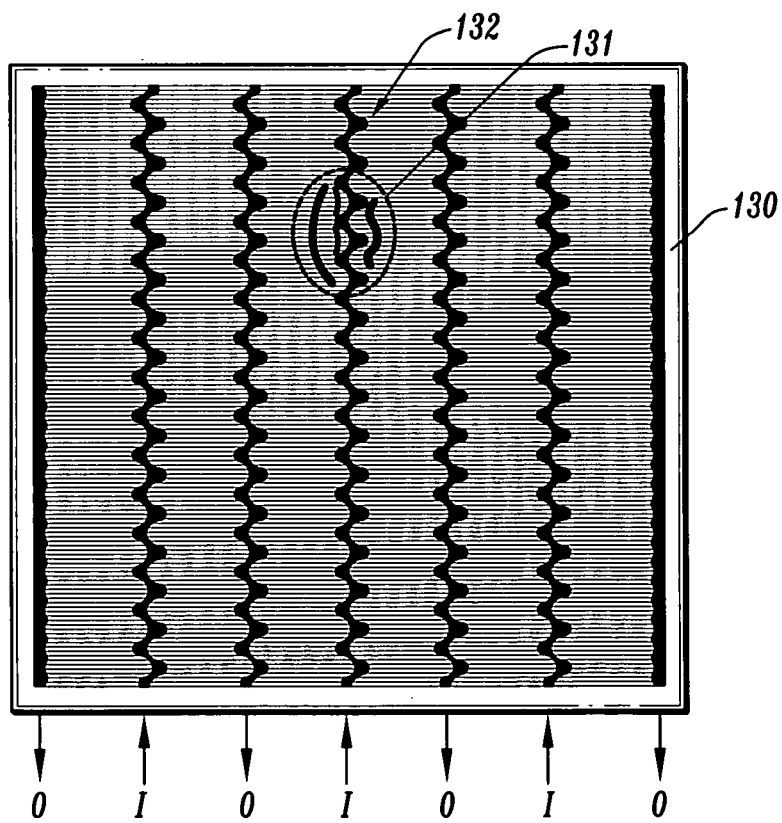
FIG. 13 is a diagram that schematically illustrates a method for providing a locally increased cooling capacity for a "hot spot" region of a chip according to another exemplary embodiment of the invention.

For example, FIG. 13 schematically illustrates a method for providing a locally increased cooling capacity for a hot spot region of a chip according to another exemplary embodiment of the invention. In particular, FIG. 13 depicts an exemplary microchannel plate (130) having a multi-zone heat exchange structure similar to that shown in FIG. 12, wherein a region (131) (hot spot region) corresponds to a "hot spot" of a chip. However, in the exemplary embodiment of FIG. 13, the hot spot (131) of the chip is assumed to have a significantly higher power density as compared to the average power density of the chip to be cooled, which can render the method of FIG. 12 insufficient for cooling the hot spot by merely aligning an input manifold to the hot spot. Accordingly, in the exemplary embodiment of FIG. 13, increased localized cooling for the hot spot region (131) can be obtained by aligning an input manifold (132) with the hot spot region (131), as well as changing the microchannel pattern in an area surrounding the portion of the input manifold (132) corresponding to the hot spot region (131) by using interrupted or staggered fins (as shown schematically in the exemplary embodiments of FIG. 17A or 17B).

Figure 17A:
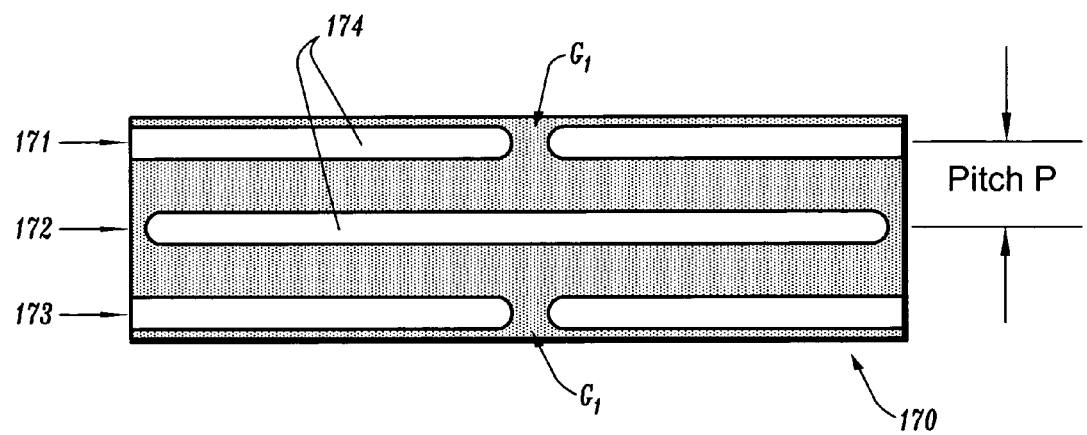
FIGS. 17A and 17B are schematic diagrams that illustrate different microfin patterns that can be implemented in a microchannel cooler device, according to exemplary embodiments of the invention.

In particular, FIG. 17A schematically illustrates an interrupted microfin pattern (170) comprising a plurality of rows of parallel microfins (171, 172, 173) that are separated by pitch P. Each row of microfins (171, 172, 173) comprises a plurality of relatively long microfin structures (174) that are separated by small gaps (G1) (interruptions) between the microfins (174) along the row, wherein the gaps (G1) of adjacent rows are staggered. The interrupted microfin pattern (170) defines relatively long microchannels that enable cross mixing of fluid between the microchannels.

Figure 17B:
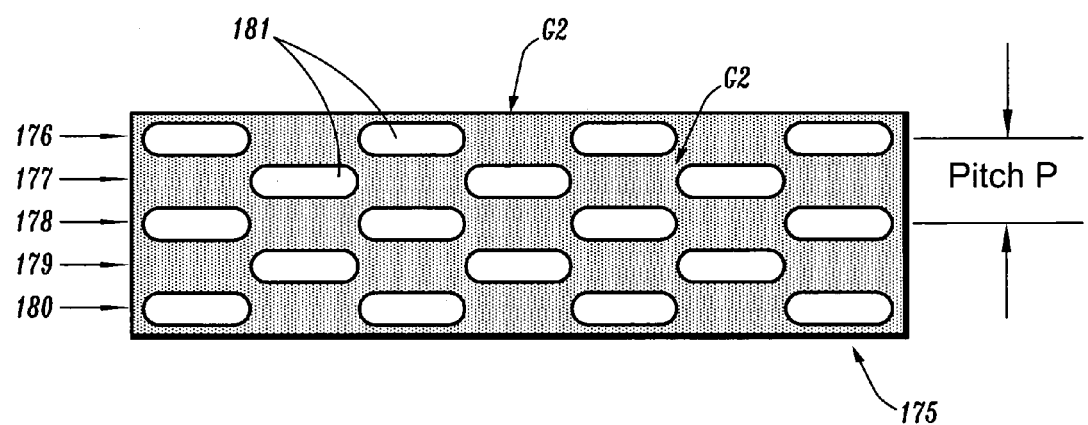

On the other hand, FIG. 17B schematically illustrates a staggered microfin pattern (175) comprising a plurality of rows of parallel microfins (176, 177, 178, 179, 180), wherein every other row (e.g., row 176 and 178) are separated by the same pitch P (as in FIG. 17A). Each row of microfins (176, 177, 178, 179, 180) comprises relatively short microfin structures (181) with gaps (G2) (interruptions) between the microfins (181) along that row, wherein the gaps (G2) of adjacent rows are staggered. In the exemplary embodiment of FIG. 17B, the length of the microfin structures (181) and gaps (G2) are relatively the same. The exemplary microfin pattern depicted in FIG. 9B is formed with a staggered pattern similar to that depicted in FIG. 17B.

Referring back to FIG. 13, a high performance microchannel pattern comprising a staggered microfin pattern (as shown in FIG. 17B) can be used the hot spot region (131) to achieve a 2× increase in the heat transfer coefficient. The increase in the heat transfer rate is expected for two reasons. First, each microfin segment is too short to yield developed flow and, consequently, each microfin segment behaves like a short channel with expected higher local heat transfer coefficient and some fractional increase in pressure drop. In addition, the staggered array delivers energy to the fluid stream centerline, while preserving the fin to fin pitch of the continuous microfin patterns in the surrounding regions, thus behaving like a narrower channel thermally. Advantageously, the use of staggered or interrupted fins in the hot spot region (131) will provide a local increase in the heat transfer coefficient. But since the modified fin pattern is in parallel with regions of continuous fins, the flow can be reduced because staggered or interrupted fins cause an increase in the pressure drop along the microchannel, as compared to the regions of continuous fins. Such reduction in flow may be acceptable for more significant increases in power density when limited to small sections of the chip representing only a fairly modest fraction of the total power for which the microchannel cooler is designed. It is desirable to limit the reduction of flow per unit area perpendicular to the channels in the regions containing the modified fin pattern to less than about ½ of that in the regions containing the normal fin pattern. Alternatively, it is desirable to limit the reduction of the fluid velocity in the regions containing the modified fin pattern to less than about ½ of that in the regions containing the normal fin pattern.

However, as noted above, it is preferable for all the heat exchanger zones to be connected in "parallel" which means that they should all be designed to operate with the same pressure drop between the inlet and outlet manifolds and the manifolds should be designed with variable cross-sectional areas to provide uniform fluid flow across the heat exchanger sections.

Figure 14:
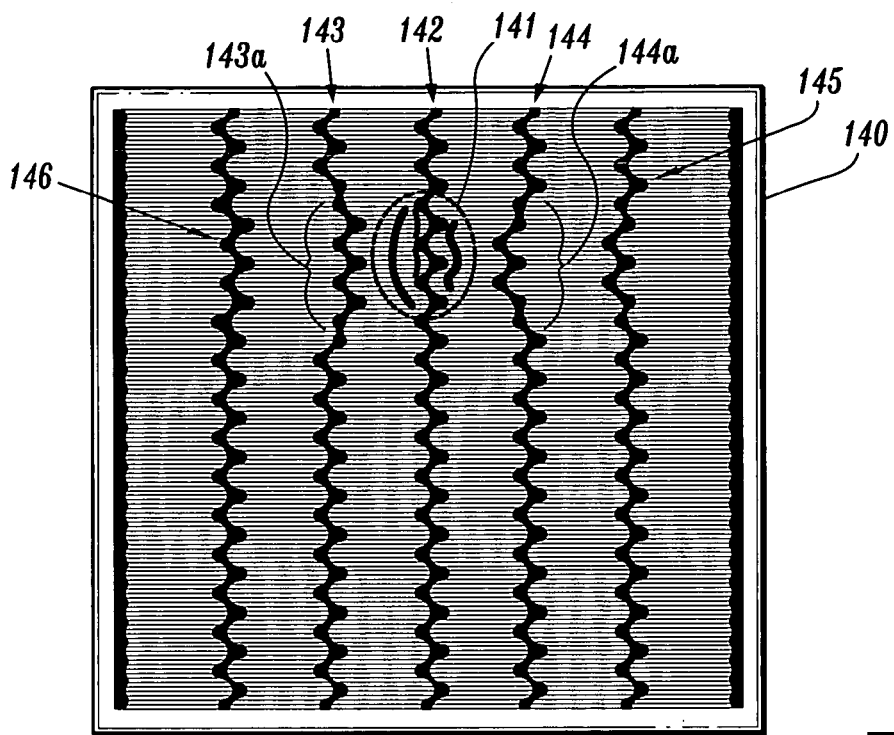
FIG. 14 is a diagram that schematically illustrates a method for providing a locally increased cooling capacity for a "hot spot" region of a chip according to yet another exemplary embodiment of the invention.

FIG. 14 schematically illustrates a method for providing a locally increased cooling capacity for a hot spot region of a chip according to yet another exemplary embodiment of the invention. In particular, FIG. 14 depicts an exemplary microchannel plate (140) having a 6-zone heat exchange structure, wherein a region (141) (hot spot region) corresponds to a "hot spot" of a chip. Similar to the method of FIG. 13, localized cooling is obtained by aligning an input manifold (142) with the hot spot region (141) and forming a high performance microchannel pattern (e.g., an interrupted or staggered microfin pattern) for the hot spot region (141). However, FIG. 14 further depicts a method for providing localized increased cooling by moving/rerouting portions (143a) and (144a) of respective output manifolds (143) and (144) toward the hot spot region (141) aligned with the input manifold (142). This method effectively reduces the channel length of the microchannels in the regions of the heat exchanger zones between the portion of the input manifold (142) aligned to the hot spot region (141) and the rerouted portions (143a) and (144a) of output manifolds (143) and (144), such that the pressure drop is the regions of the heat exchanger zones with the shortened channel lengths is substantially the same as the pressure drop in the other regions of such heat exchanger zones wherein the microchannels are longer and continuous (not interrupted or staggered).

With the exemplary localized cooling method of FIG. 14, assuming the number of heat exchanger zones is constant, the length of the microchannels in the regions of the heat exchanger zones between the manifold portion (144a) and input manifold (145) and between the manifold portion (143a) and input manifold (146) will be increased, thereby reducing the flow and hence cooling in these regions. However, this may be acceptable depending on the power map of the chip.

Figure 15:
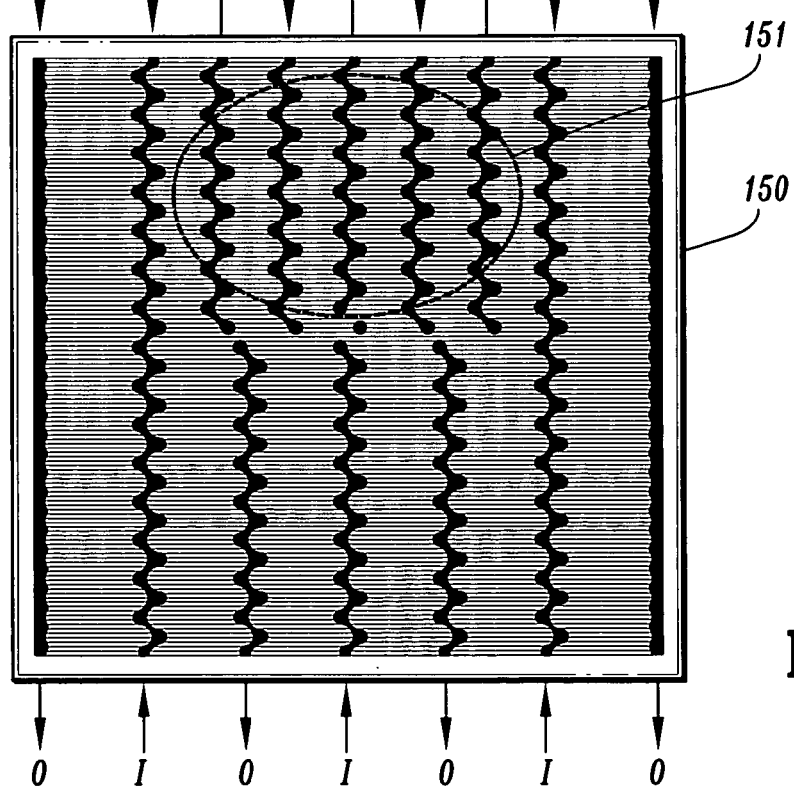
FIG. 15 is a diagram that schematically illustrates a method for providing a locally increased cooling capacity for a "hot spot" region of a chip according to another exemplary embodiment of the invention.

FIG. 15 schematically illustrates a method for providing a locally increased cooling capacity for a hot spot region of a chip according to another exemplary embodiment of the invention. In particular, FIG. 15 depicts an exemplary microchannel plate (150) generally having a 6-zone heat exchange structure, wherein a region (151) (hot spot region) corresponds to a "hot spot" of a chip. FIG. 15 depicts an exemplary microchannel plate (150) that is designed to provide increased cooling capacity for a relatively large hot spot of a chip, wherein additional manifolds are formed in the region (151) so that the channel lengths can be reduced locally. In the exemplary embodiment of FIG. 15, six heat exchanger zones are defined for cooling those regions of the chip with average power density. However, in the hot spot region (151), additional manifolds are formed such that six heat exchanger zones are defined for the hot spot alone.

Figure 16:
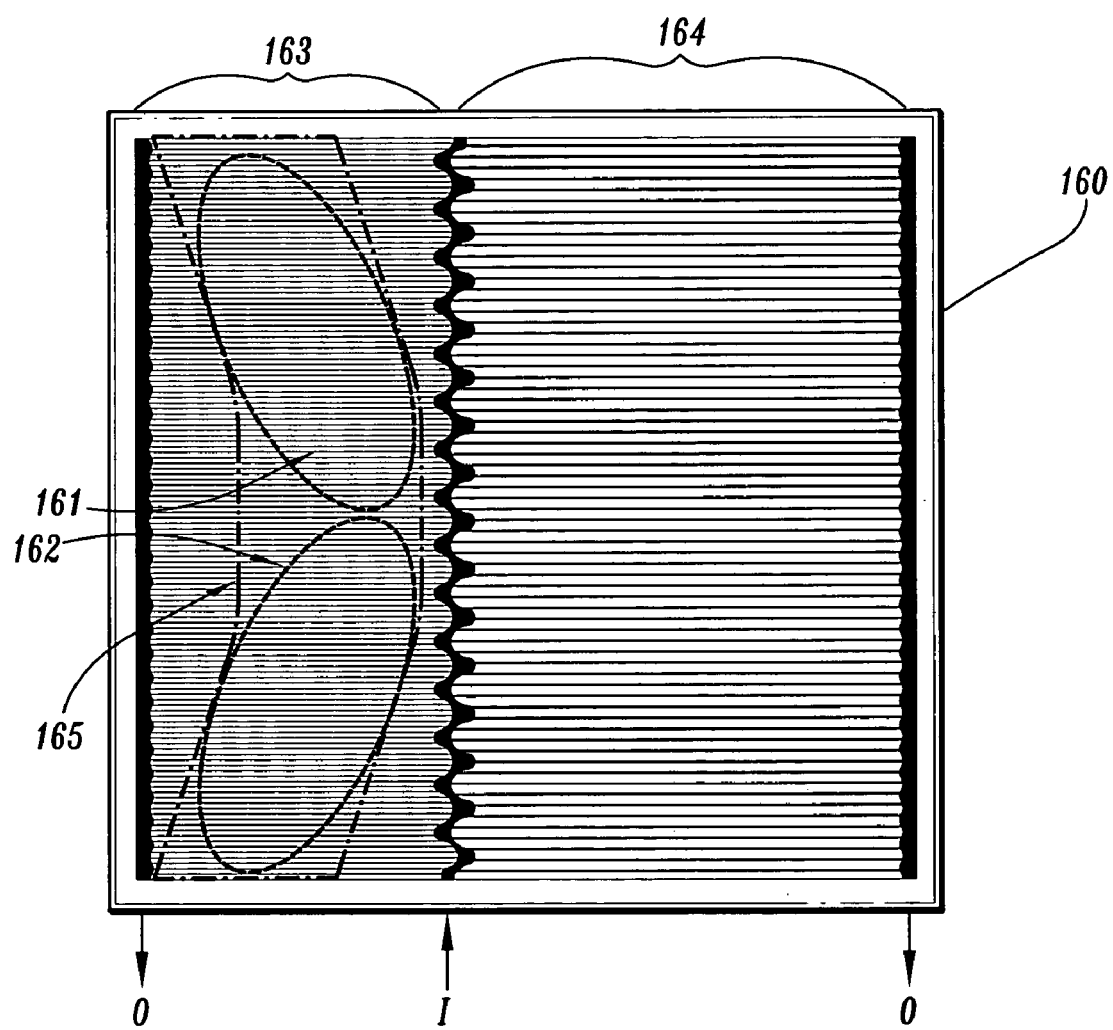
FIG. 16 is a diagram that schematically illustrates a method for providing a locally increased cooling capacity for a "hot spot" region of a chip according to yet another exemplary embodiment of the invention.

FIG. 16 schematically illustrates a method for providing a locally increased cooling capacity for hot spot regions of a chip according to yet another exemplary embodiment of the invention. More specifically, FIG. 16 depicts an exemplary microchannel plate (160) having regions (161) and (162) that correspond to two relatively large "hot spots" of a chip. In the exemplary embodiment of FIG. 16, the power density is assumed to be very high in the hot spots of the chip and relatively small in the remaining region of the chip. The microchannel plate (160) comprises two heat exchanger zones (163) and (164), wherein the heat exchanger zone (163) is designed to cool the higher power density region of the chip corresponding to hot spot regions (161) and (162), and wherein the heat exchanger zone (164) is designed to cool the lower power density regions of the chip. To provide increased cooling capacity for the hot spot regions of the chip while maintaining the pressure drop across the heat exchanger zones (163) and (164) substantially the same, the heat exchanger zone (163) is designed with relatively shorter and finely-pitched microchannels, whereas the heat exchanger zone (164) is designed with relatively longer and coarsely-pitched microchannels.

In another exemplary embodiment, in the shorter heat exchanger zone (163), two different microchannel patterns can be formed. More specifically, by way of example, a high performance microchannel design can be used within a region (165) bounded by the dot-dashed lines, which may result in a higher pressure drop per unit length, whereas a lower performance microchannel design can be used in the area of the heat exchanger zone (163) that surrounds the region (165). Moreover, in the exemplary embodiment of FIG. 16, the total length of the microchannels in the high performance region (165) and the total length of the surrounding lower performance microchannel region is the same for all the individual microchannels in the shorter heat exchanger zone (163). The high performance microchannel region (165) may include microchannels that are patterned, structured or arranged in one of various ways. For instance, the region (165) may include finer-pitched microchannels, or microfins that are formed with staggered or interrupted patterns (as in FIGS. 17A and 17B). Alternatively, the microchannels in region (165) may have the same pitch but reduced channel width.

In other exemplary embodiments of the invention, increased local cooling capability can be attained by designing the microfins to extend into the manifold region (i.e., extend into the recessed regions (R)), although such methods can result in an increased pressure drop depending on how far the microfins extend into the recessed region. In another embodiment, the thermal microfins can be designed such that every other fin has a longer length relative to its adjacent fin, wherein the extra length places the fin endings directly under the inlet/outlet fluid vias on the manifold plate. With this embodiment, half of the microfins can be used to increase the conduction paths under the inlet fluid vias and increase conduction cooling on areas with fluid stagnation points under the outlet fluid vias, thus locally increasing the overall cooling capability in the manifold regions, although there is a modest increase in the pressure drop.

Although exemplary embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An integrated microchannel cooler device for cooling an IC (integrated circuit) chip having a non-uniform power map, the integrated microchannel cooler device comprising:
   a plurality of alternating input and output manifolds that extend in a same direction within the integrated cooler device; and
   a plurality of heat exchanger zones, wherein each heat exchanger zone comprises a plurality of thermal microfins which define a microchannel pattern of microchannels which extend between an adjacent input and output manifold to provide fluid flow paths between the adjacent input and output manifold,
   wherein the microchannel pattern of one or more of the heat exchanger zones is varied to provide a heat transfer performance that corresponds to an expected power map of the IC chip; and
   wherein the input and output manifolds and microchannel patterns of the heat exchanger zones are structured to provide an average fluid velocity in a region of a heat exchanger zone that corresponds to an expected hot spot region of the IC chip, which is substantially the same as, or at least within about 50% of, an average fluid velocity in other regions of the heat exchanger zone that do not correspond to an expected hot spot region of the IC chip.

2. The integrated microchannel cooler device of claim 1, wherein at least one input manifold of the integrated microchannel cooler device is arranged to align with an expected hot spot region of the IC chip.

3. The integrated microchannel cooler device of claim 1, wherein the microchannel pattern of one or more of the heat exchanger zones is varied locally to provide a heat transfer performance that corresponds to local variations of the expected power map of the IC chip.

4. The integrated microchannel cooler device of claim 3, at least one heat exchanger zone comprises a first pattern of microchannels that provides a heat transfer performance sufficient for an expected average power density of the IC chip and a second pattern of microchannels that is disposed to correspond to an expected hot spot region of the IC chip, wherein the second pattern of microchannels provides a heat transfer performance sufficient for an expected greater than average power density of the hot spot.

5. The integrated microchannel cooler device of claim 4, wherein the first pattern of microchannels comprises continuous microchannels and wherein the second pattern of microchannels comprises a pattern of staggered or interrupted microfins.

6. The integrated microchannel cooler device of claim 4, wherein the first pattern of microchannels comprises continuous parallel microchannels spaced with a first pitch and wherein the second pattern of microchannels comprises continuous parallel microchannels spaced with a second pitch that is smaller than the first pitch, and more preferably greater than or equal to about one-half the first pitch.

7. The integrated microchannel cooler device of claim 4, wherein the first pattern of microchannels comprises a pattern of staggered or interrupted microfins spaced with a first pitch and wherein the second pattern of microchannels comprises a pattern of staggered or interrupted microfins spaced with a second pitch.

8. The integrated microchannel cooler device of claim 4, wherein the first and second pattern of microchannels of the heat exchanger zone are arranged in series between an adjacent input and output manifold.

9. The integrated microchannel cooler device of claim 8, wherein the first pattern of microchannels comprises regions where a flow per unit width perpendicular to the first and second pattern of microchannels in series is not reduced by more than ½ as compared to the first pattern of microchannels alone.

10. The integrated microchannel cooler device of claim 1, wherein the microchannel pattern of one or more of the heat exchanger zones is varied by using a same first microchannel pattern for one or more heat exchanger zones, which provides a heat transfer performance sufficient for an expected average power density of the IC chip, and using at least one second microchannel pattern in a heat exchanger zone that corresponds to an expected hot spot region of the IC chip, which provides an increased heat transfer performance sufficient for an expected greater than average power density of the chip.

11. The integrated microchannel cooler device of claim 10, wherein the first microchannel pattern comprises continuous microchannels which have a first length that extends between an input and output manifold, and which are spaced apart with a first pitch, and wherein the at least one second microchannel pattern comprises continuous microchannels which have a second length that extends between an input and output manifold, and which are spaced apart with a second pitch, wherein the first length and pitch is greater than the second length and pitch.

12. The integrated microchannel cooler device of claim 1, wherein the microchannel pattern of one or more of the heat exchanger zones is varied by using a same first microchannel pattern for one or more heat exchanger zones, which provides a heat transfer performance sufficient for an expected average power density of the IC chip, and using at least a second and a third microchannel pattern in a heat exchanger zone that corresponds to an expected hot spot region of the IC chip, which provide an increased heat transfer performance sufficient of an expected greater than average power density of the chip.

13. The integrated microchannel cooler device of claim 12, wherein the first microchannel pattern comprises continuous microchannels which have a first length that extends between an input and output manifold, and which are spaced apart with a first pitch, and wherein the at least a second and third microchannel patterns are disposed in series over the heat exchanger zone that corresponds to the expected hot spot region of the IC chip, and wherein a total proportion of the at least second and third microchannel pattern is substantially the same for any given channel over the heat exchanger zone.

14. The integrated microchannel cooler device of claim 13, wherein the at least second microchannel pattern is disposed to substantially align with the expected hot spot region of the IC chip and provide a second heat transfer performance sufficient for an expected power density of hot spot region of the IC chip and wherein the third microchannel pattern is disposed in areas of the heat exchanger zone surrounding the second microchannel pattern and provides a third heat transfer performance which is less than the second heat transfer performance, but greater than a first heat transfer performance provided by the first microchannel pattern.

15. An apparatus for cooling an electronic device, comprising:

an integrated microchannel cooler device comprising a plurality of alternating input and output manifolds extending in a same direction, wherein at least one heat exchanger zone is defined between each adjacent input and output manifold, wherein each heat exchanger zone comprises a plurality of thermal microfins which define microchannels that provide a fluid flow path between adjacent manifolds; and an IC (integrated circuit) chip having a non-active surface which is thermally bonded to the integrated microchannel cooler device, wherein the IC chip and integrated microchannel cooler are bonded such that an input manifold of the integrated microchannel cooler is aligned with a hot spot region of the IC chip.

16. The apparatus of claim 15, wherein said input manifold is aligned with a central point of the hot spot region.

17. The apparatus of claim 15, wherein a distance between adjacent manifolds is reduced in a region aligned to the hot spot region and a flow per unit width perpendicular to the microchannels does not vary by more than ½ in different regions of the heat exchanger zone.

18. The apparatus of claim 15, wherein a number of heat exchanger regions of the integrated microchannel cooler device across the IC chip is varied such that the number of heat exchanger zones in a portion of the integrated microchannel cooler device that is aligned to the hot spot region of the IC chip is increased to provide increased cooling for the hot spot region.

* * * * *